(12) United States Patent
Liao

(10) Patent No.: US 10,879,052 B2
(45) Date of Patent: Dec. 29, 2020

(54) PLASMA PROCESSING APPARATUS AND MANUFACTURING METHOD USING THE SAME

(71) Applicant: TAIWAN SEMICONDUCTOR MANUFACTURING CO., LTD., Hsinchu (TW)

(72) Inventor: Han-Wen Liao, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/520,568

(22) Filed: Jul. 24, 2019

(65) Prior Publication Data
US 2020/0161102 A1 May 21, 2020

Related U.S. Application Data

(60) Provisional application No. 62/770,678, filed on Nov. 21, 2018.

(51) Int. Cl.
| | |
|---|---|
| H01L 21/33 | (2006.01) |
| H01J 37/32 | (2006.01) |
| H01L 21/66 | (2006.01) |
| H01L 21/3065 | (2006.01) |
| H01L 21/02 | (2006.01) |
| H01L 21/762 | (2006.01) |

(52) U.S. Cl.
CPC .. H01J 37/32697 (2013.01); H01J 37/32082 (2013.01); H01J 37/32449 (2013.01); H01J 37/32715 (2013.01); H01L 21/02274 (2013.01); H01L 21/3065 (2013.01); H01L 22/10 (2013.01); *H01J 2237/332* (2013.01); *H01J 2237/334* (2013.01); *H01L 21/76224* (2013.01)

(58) Field of Classification Search
CPC .......... H01L 21/02274; H01L 21/3065; H01L 21/76224; H01L 22/10; H01L 22/12; H01L 22/34; H01L 22/20; H01L 22/26; H01J 37/32697; H01J 37/32082; H01J 37/32449; H01J 37/32715; H01J 2237/332; H01J 2237/334; H01J 2237/3227; H01J 2237/3221
See application file for complete search history.

(56) References Cited

U.S. PATENT DOCUMENTS

| | | | | |
|---|---|---|---|---|
| 4,392,938 A | * | 7/1983 | Harra | C23F 4/00 |
| | | | | 204/192.32 |
| 6,178,919 B1 | * | 1/2001 | Li | H01J 37/32623 |
| | | | | 118/723 E |

(Continued)

FOREIGN PATENT DOCUMENTS

| | | | | |
|---|---|---|---|---|
| CN | 1012713214 | * | 10/2008 | G01T 1/16 |
| TW | 427550 U | | 3/2001 | |

(Continued)

*Primary Examiner* — Nikolay K Yushin
(74) *Attorney, Agent, or Firm* — Maschoff Brennan

(57) ABSTRACT

A method for manufacturing a semiconductor structure includes depositing a wafer in a processing chamber. Plasma is formed in the processing chamber to process the wafer. A plasma concentration over a peripheral region of the wafer is detected. A plasma distribution over the peripheral region of the wafer is adjusted according to the detected plasma concentration.

20 Claims, 36 Drawing Sheets

(56) References Cited

U.S. PATENT DOCUMENTS

| | | | |
|---|---|---|---|
| 7,993,937 B2* | 8/2011 | Chen | H01J 37/32027 |
| | | | 257/E21.528 |
| 9,793,097 B2* | 10/2017 | Spaulding | C30B 25/14 |
| 2005/0031796 A1* | 2/2005 | Wu | H01J 37/32935 |
| | | | 427/569 |
| 2011/0070665 A1* | 3/2011 | Chen | H01J 37/32935 |
| | | | 438/5 |
| 2017/0032943 A1* | 2/2017 | Spaulding | H01J 37/3244 |

FOREIGN PATENT DOCUMENTS

| | | |
|---|---|---|
| TW | 200507041 A | 2/2005 |
| TW | 201539608 | 10/2015 |

* cited by examiner

M30

M30'

126
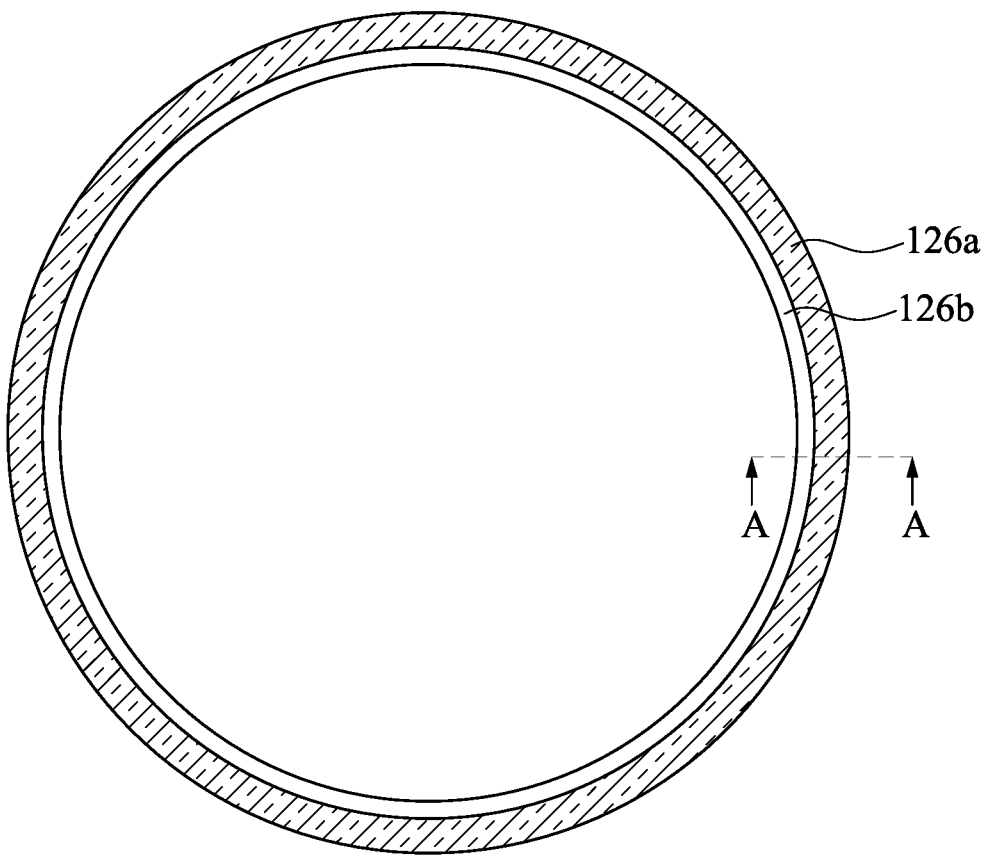
Fig. 10A
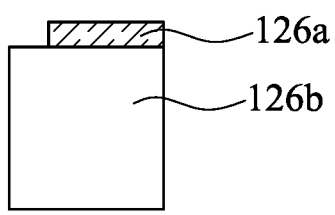
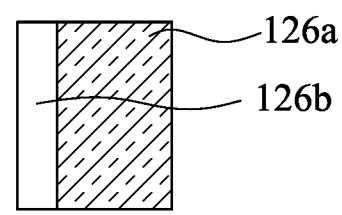
Fig. 10B
Fig. 10C

226

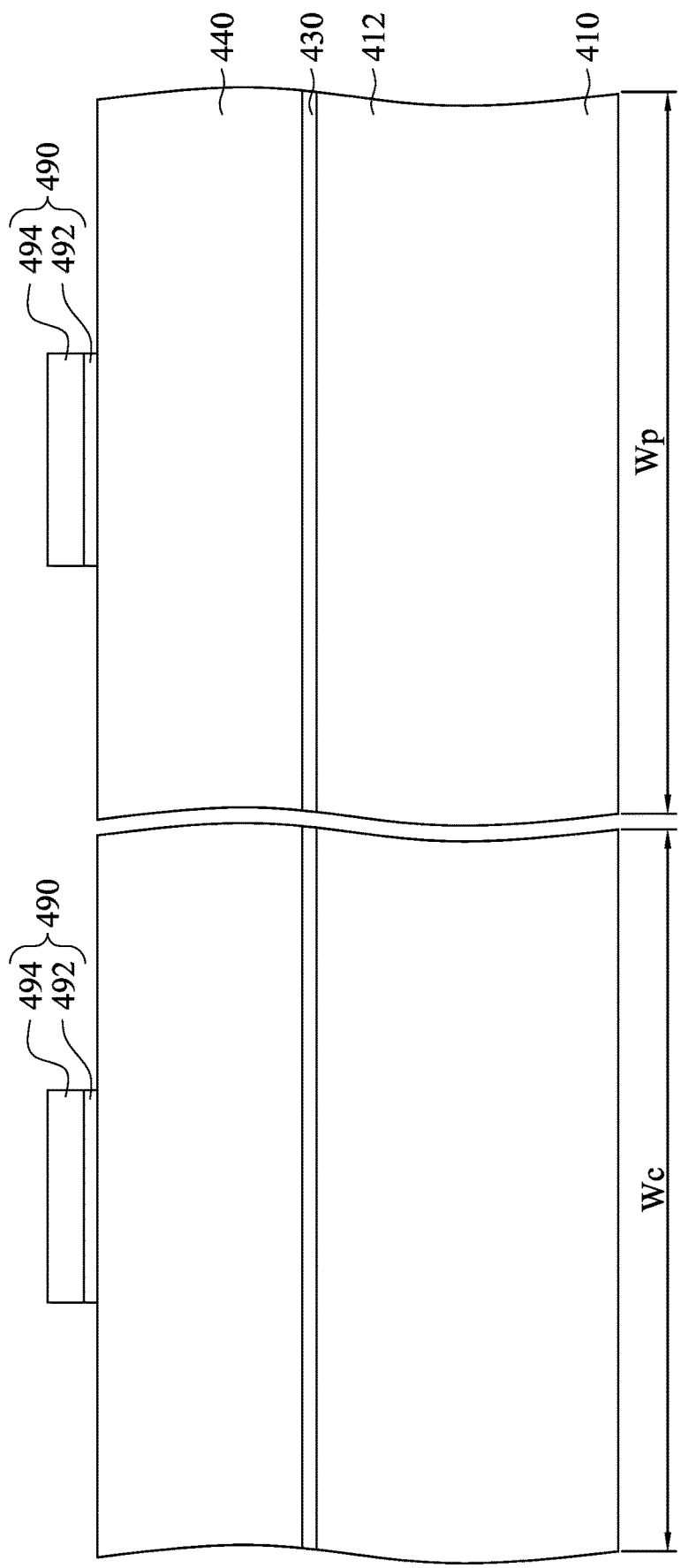

PLASMA PROCESSING APPARATUS AND MANUFACTURING METHOD USING THE SAME

PRIORITY CLAIM AND CROSS-REFERENCE

This application claims priority to U.S. Provisional Application Ser. No. 62/770,678, filed Nov. 21, 2018, which is herein incorporated by reference.

BACKGROUND

In the manufacturing of integrated circuits, patterning techniques such as photolithography and etching are used to form various features such as polysilicon lines, devices (e.g., transistors, diodes, and the like), interconnect structures, contact pads, and the like in device dies on a wafer. As design features in integrated circuits become increasingly complex (e.g., having smaller critical dimensions and/or more complex shapes), complex patterning processes may be used to form a single feature. However, due to process limitations, critical dimensions of the various patterned features may not be uniform within a wafer, which may degrade the performance of the device/die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10A is a schematic view of a top frame of the pedestal of FIG. 1 according to some embodiments.

FIGS. 10B and 10C are cross-sectional views of the line A-A in FIG. 10A according to some embodiments.

FIGS. 14A to 14G illustrate a semiconductor structure at various stages according to some embodiments.

DETAILED DESCRIPTION

Figure 1:
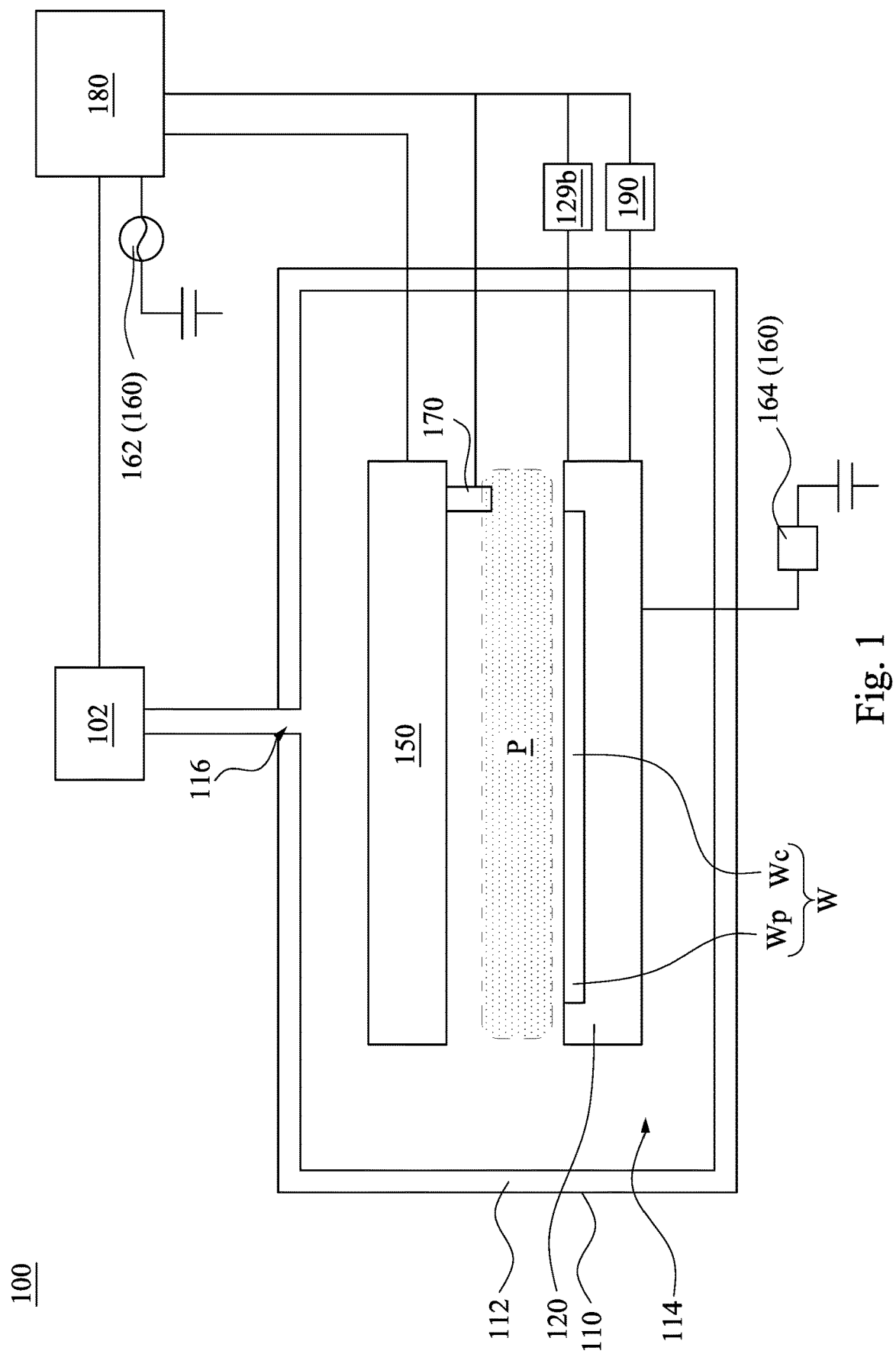
FIG. 1 is a schematic view of a plasma processing apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "bottom," "above," "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Disclosed embodiments relate to methods and apparatuses for improving plasma uniformity in wafer patterning and/or layer depositing. The embodiments such as those disclosed herein are applicable not only to front-end-of-line (FEOL) processing but also to middle-end-of-line (MEOL) processing and back-end-of-line (BEOL) processing.

FIG. 1 is a schematic view of a plasma processing apparatus 100 in accordance with some embodiments. The plasma processing apparatus 100 is configured to etch one or more wafers W. In some embodiments, the wafer W is positioned for etching by plasma P generated by a first DC/AC RF source 160. The wafer W includes a center region Wc and a peripheral region Wp surrounds the center region Wc. In some embodiments, the plasma processing apparatus 100 includes a processing chamber 110, a pedestal 120, a top electrode 150, a first DC/AC RF source 160, a sensing module 170, a control module 180, and a temperature controller 190.

The processing chamber 110 has at least one sidewall 112. The sidewall 112 defines an accommodating space 114 in the processing chamber 110 to accommodate the wafer W. The processing chamber 110 further has an inlet port 116. The inlet port 116 is configured for admission of process gas into the processing chamber 110 from an external process gas source 102.

Figure 2A:
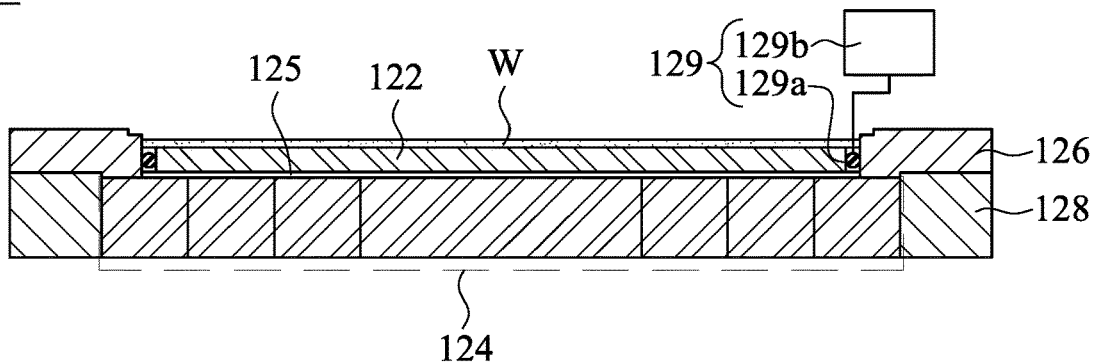
FIGS. 2A to 2E are local cross-sectional views of the pedestal in FIG. 1 according to some embodiments.
Figure 2B:
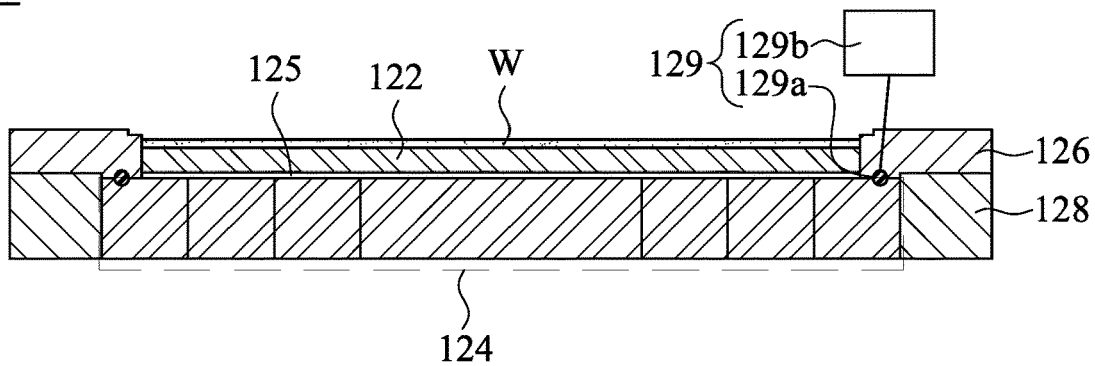
Figure 2C:
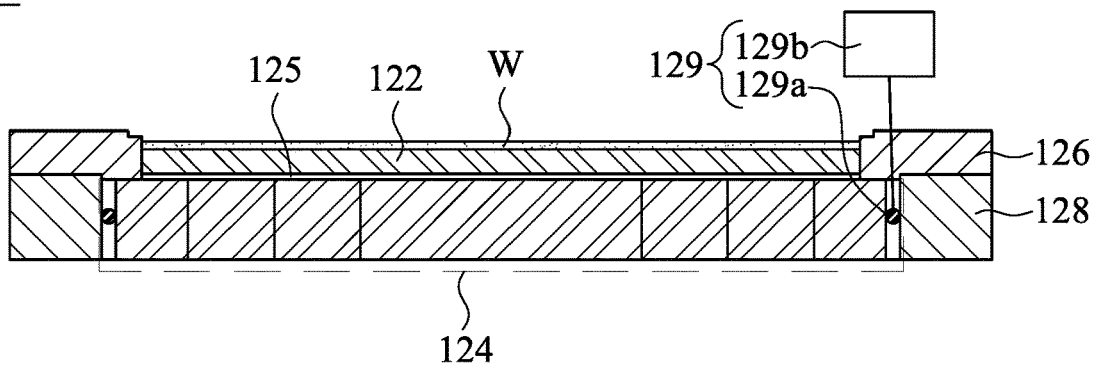
Figure 2D:
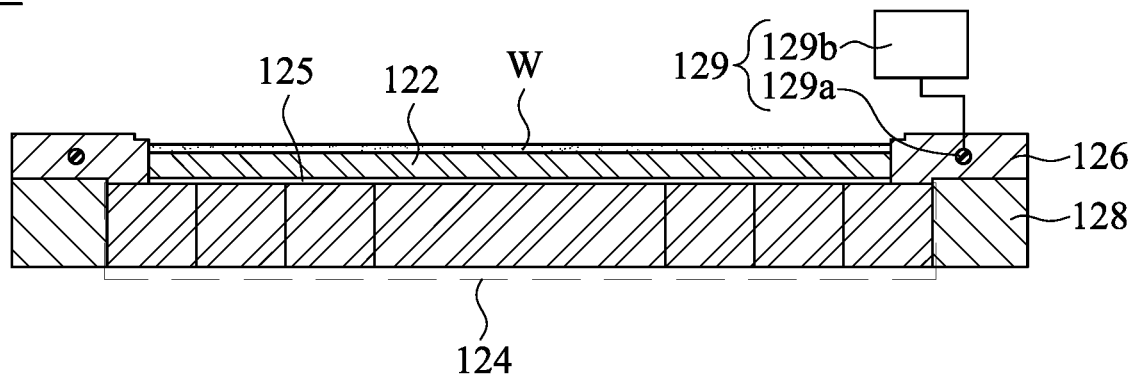
Figure 2E:
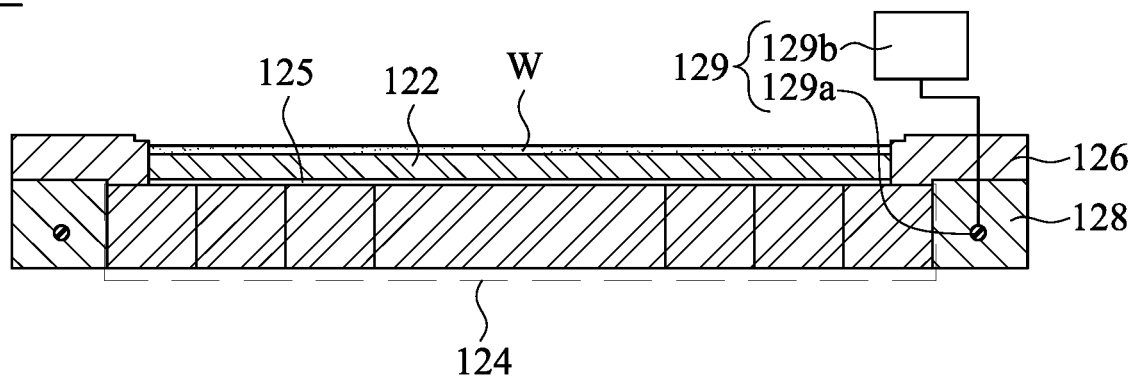

The pedestal 120 is disposed in the processing chamber 110 to support the wafer W. In some embodiments, the pedestal 120 is an electrostatic chuck (ESC). The pedestal 120 may be rotatable. FIG. 2A is a local cross-sectional view of the pedestal 120 in FIG. 1 according to some embodiments. Reference is made to FIGS. 1 and 2A. The pedestal 120 includes a top dielectric sheet 122, a bottom dielectric sheet 124, and a conductive sheet 125. The conductive sheet 125, serving as a chuck electrode, is sandwiched between the top and bottom dielectric sheets 122 and 124. In some embodiments, the top and bottom dielectric sheets 122 and 124 are made of polyimide or other suitable materials.

The first DC/AC RF source 160 includes an RF source 162 and a biasing element 164. The biasing element 164 is connected to the conductive sheet 125. When a desired voltage is applied to the conductive sheet 125 from the biasing element 164, a Coulomb force is generated between the wafer W and the conductive sheet 125 which attracts and holds the wafer W on the pedestal 120.

Reference is made to FIG. 1. The top electrode 150 is disposed in the processing chamber 110 and over the pedestal 120. The conductive sheet 125 of the pedestal 120 and the top electrode 150 are coupled with the RF source 162 of the first DC/AC RF source 160 which in turn is controlled by the control module 180. A desired voltage applied to the conductive sheet 125 and the top electrode 150 ionizes the process gas introduced into the processing chamber 110 to create plasma P within the processing chamber 110 used in etching the wafer W. In other words, the first DC/AC RF source 160 generates RF electromagnetic field to convert the process gas between the top electrode 150 and the pedestal 120 into plasma P for etching the wafer W.

FIGS. 2A to 2E are local cross-sectional views of the pedestal 120 in FIG. 1 according to some embodiments. The pedestal 120 further includes a top frame 126, a bottom frame 128, and an edge electric field generator 129. The top frame 126 surrounds the top dielectric sheet 122, and the bottom frame 128 surrounds the bottom dielectric sheet 124. The top frame 126 is disposed over the bottom frame 128 and an edge portion of the bottom dielectric sheet 124. The edge electric field generator 129 is disposed at the edge of the top dielectric sheet 122 and/or the bottom dielectric sheet 124 and includes a conductive element 129a and a second DC/AC RF source 129b connected to the conductive element 129a. The conductive element 129a is a wire, a coil, or a conductive plate, and may be made of metal or other suitable materials. In some embodiments, the conductive element 129a is disposed between the top frame 126 and the top dielectric sheet 122 (see FIG. 2A), between the top frame 126 and the bottom dielectric sheet 124 (see FIG. 2B), between the bottom frame 128 and the bottom dielectric sheet 124 (see FIG. 2C), in the top frame 126 (see FIG. 2D), in the bottom frame 128 (see FIG. 2E), or combinations thereof. In FIGS. 2A-2E, the conductive elements 129a are ring-shaped. When a desired voltage is applied to the conductive element 129a from the second DC/AC RF source 129b, an electrical field is formed around the edge of the wafer W, and the plasma distribution above the edge of the wafer W can be adjusted or tuned.

Reference is made to FIG. 1. The sensing module 170 is disposed in the processing chamber 110. In some embodiments, the sensing module 170 is disposed over the edge of the wafer W. For example, the sensing module 170 is fixed on the sidewall 112 of the processing chamber 110 or on the top electrode 150 (see FIG. 1). The sensing module 170 is configured to sense a plasma concentration over the edge of the wafer W. In some embodiments, the sensing module 170 is an optical emission spectroscopy (OES) which provides the capability of monitoring the plasma chemistry reactions by a non-invasive method. OES is an in-situ sensor for plasma process monitoring, which does not interfere with the plasma P. OES detects the plasma emission lights in the processing chamber 110. The plasma emission lights have rich information about the plasma species, which can be used to monitor the etching rate, uniformity, selectivity, critical dimensions, and even the profile of etching features on the wafer W. It is noted that the OES is an example, and does not limit the present disclosure.

The control module 180 is electrically connected to the sensing module 170 and the second DC/AC RF source 129b. The control module 180 is configured to control the power of the first DC/AC RF source 160. Furthermore, the control module 180 is further configured to control the power of the second DC/AC RF source 129b according to the plasma concentration detected by the sensing module 170, and the controlling processes will be discussed in more detail below in FIG. 8A.

Figure 3:
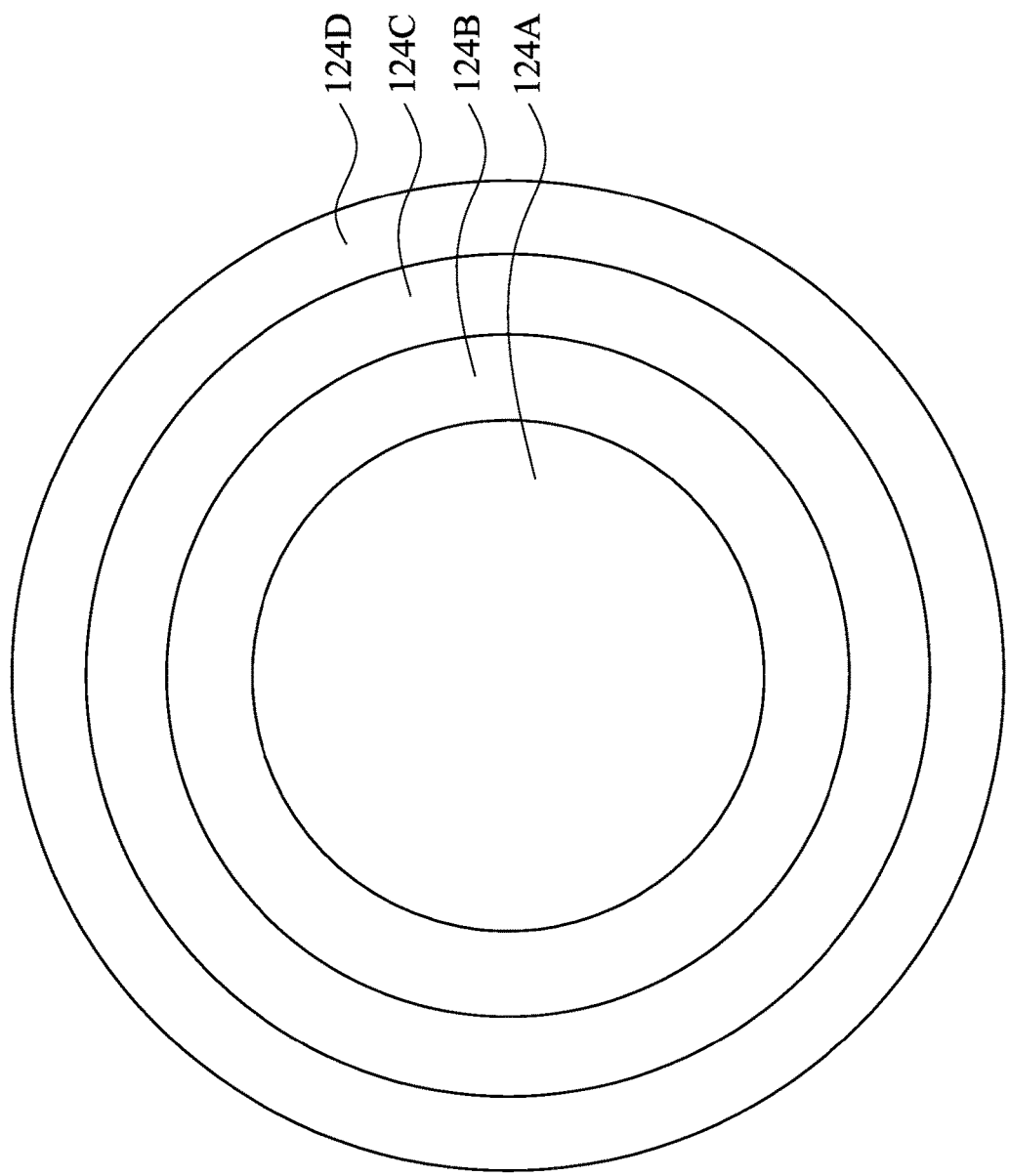
FIG. 3 is a top view of the bottom dielectric sheet of FIG. 1.

FIG. 3 is a top view of the bottom dielectric sheet 124 of FIG. 1. Reference is made to FIGS. 1 and 3. In some embodiments, the bottom dielectric sheet 124 includes plural zones. For example, the bottom dielectric sheet 124 includes an inner zone 124A, a middle zone 124B, an intermediate zone 124C, and an outer zone 124D. The middle zone 124B surrounds the inner zone 124A, the intermediate zone 124C surrounds the middle zone 124B, and the outer zone 124D surrounds the intermediate zone 124C. The zones 124A, 124B, 124C, and 124D are concentric circles. The outer zone 124D is adjacent to the bottom frame 128 (FIGS. 2A-2E). The bottom dielectric sheet 124 (i.e., the inner zones 124A, the middle zone 124B, the intermediate zone 124C, and the outer zone 124D) is connected to the temperature controller 190, which is configured to heat and/or cool the different zones to increase/decrease etching rates over different zones and adjust the critical dimensions of the wafer W. The temperature controller 190 is further connected to the control module 180, such that the temperature controller 190 controls the temperatures of the inner zones 124A, the middle zone 124B, the intermediate zone 124C, and the outer zone 124 according to the plasma concentration detected by the sensing module 170, and the controlling processes will be discussed in more detail below in FIG. 8B.

Figure 4:
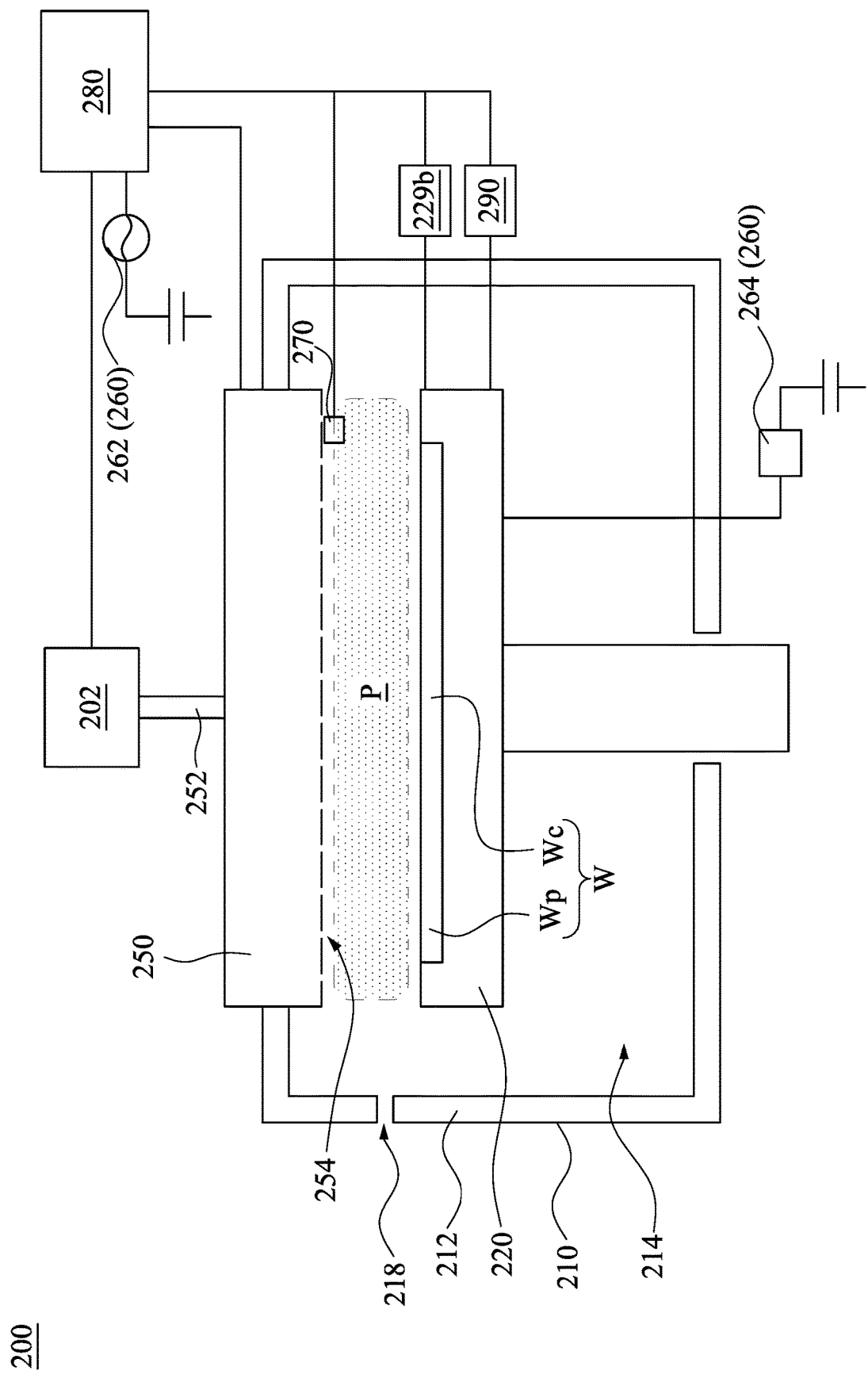
FIG. 4 is a schematic view of a plasma processing apparatus in accordance with some embodiments.

FIG. 4 is a schematic view of a plasma processing apparatus 200 in accordance with some embodiments. The difference between the plasma processing apparatus 200 and 100 of FIG. 1 is that the plasma processing apparatus 200 is configured to deposit a layer (or layers) on one or more wafers W. The wafer W includes a center region Wc and a peripheral region Wp surrounds the center region Wc. In some embodiments, the plasma processing apparatus 200 includes a processing chamber 210, a pedestal 220, a showerhead 250, a first DC/AC RF source 260, a sensing module 270, a control module 280, and a temperature controller 290.

The processing chamber 210 has at least one sidewall 212. The sidewall 212 defines an accommodating space 214 in the processing chamber 210 to accommodate the wafer W. The pedestal 220 is disposed in the processing chamber 210 to support the wafer W. In some embodiments, the pedestal 220 is an electrostatic chuck (ESC). The pedestal 220 may be rotatable.

Figure 5A:
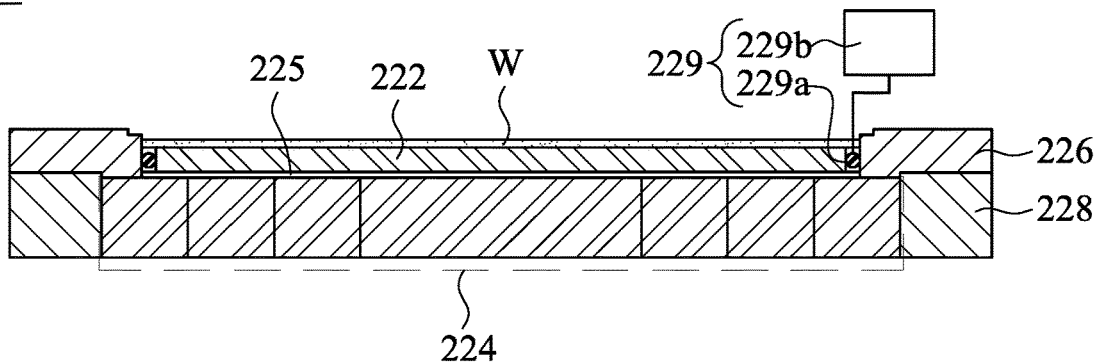
FIGS. 5A to 5E are local cross-sectional views of the pedestal in FIG. 4 according to some embodiments.
Figure 5B:
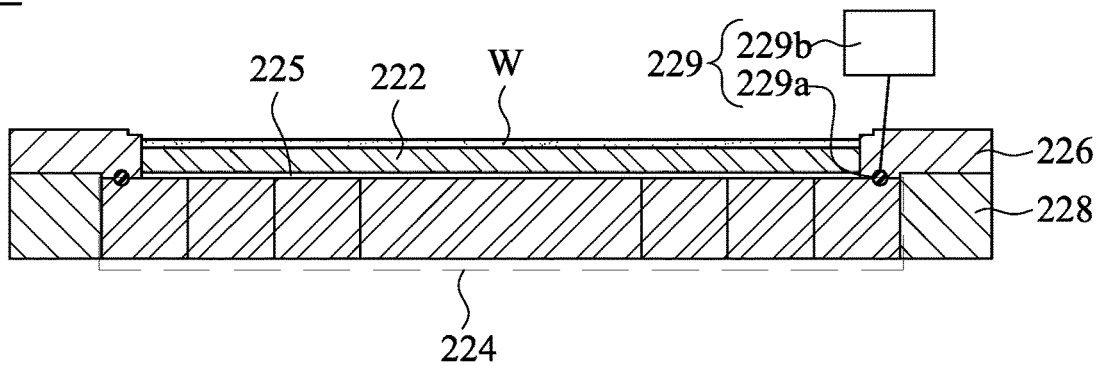
Figure 5C:
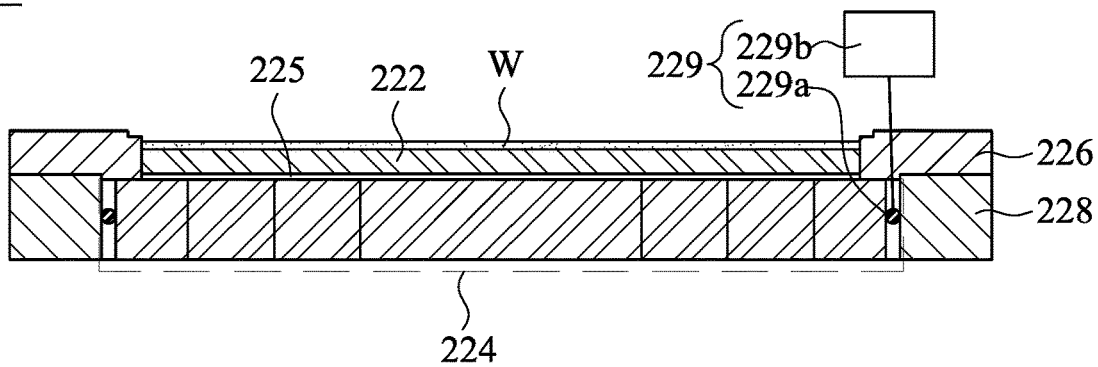
Figure 5D:
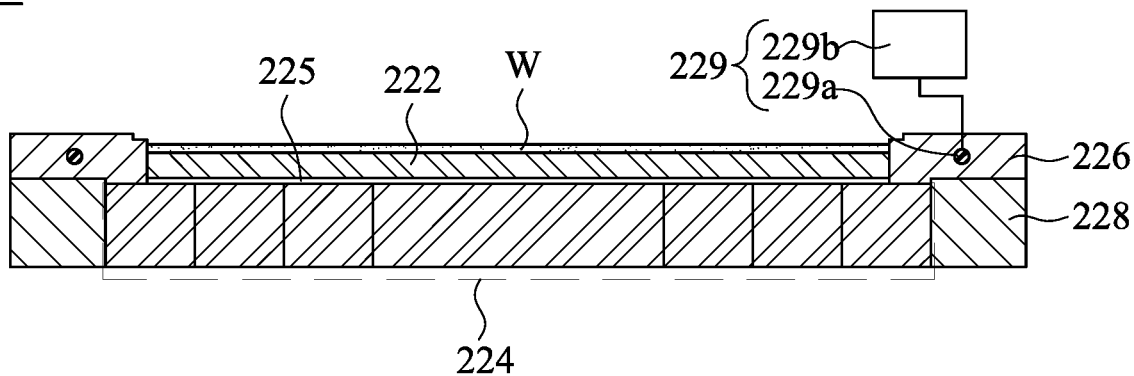
Figure 5E:
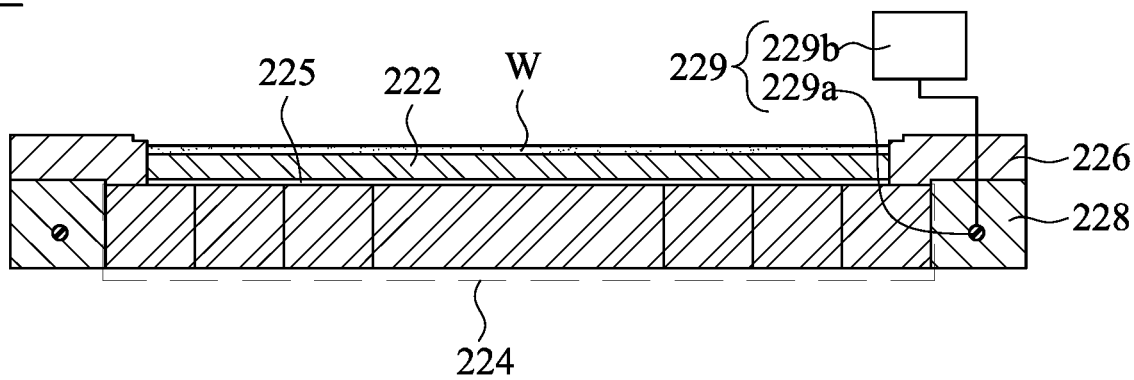

FIG. 5A is a local cross-sectional view of the pedestal 220 in FIG. 4 according to some embodiments. Reference is made to FIGS. 4 and 5A. The pedestal 220 includes a top dielectric sheet 222, a bottom dielectric sheet 224, and a conductive sheet 225. The conductive sheet 225, serving as a chuck electrode, is sandwiched between the top and bottom dielectric sheets 222 and 224. In some embodiments, the top and bottom dielectric sheets 222 and 224 are made of polyimide or other suitable materials.

The first DC/AC RF source 260 includes an RF source 262 and a biasing element 264. The biasing element 264 is connected to the conductive sheet 225. When a desired voltage is applied to the conductive sheet 225 from the biasing element 264, a Coulomb force is generated between the wafer W and the conductive sheet 225 which attracts and holds the wafer W on the pedestal 220.

Reference is made to FIG. 4. The showerhead 250 is disposed in the processing chamber 210 and above the pedestal 220 to provide precursor gases into the processing chamber 210. The RF source 262 is connected to the showerhead 250 through the control module 280. An RF signal provided by the RF source 262 can be applied to the showerhead 250, which thus acts as an electrode. The biasing element 264 is associated with the RF source 262 such that the RF power is split between the showerhead 250 and the pedestal 220. A desired voltage is applied by the RF source 262 to cause the precursor gases between the showerhead 250 and the pedestal 220 to discharge and form the plasma P.

The showerhead 250 is configured to spray precursor gases supplied from an external precursor gas source 202 into the processing chamber 210. The elements of the precursor gases deposit on the surface of the wafer W, forming a deposition layer thereon and some undesirable byproducts are pumped away in a gaseous form. For example, the unreacted precursor gases and the undesirable byproducts flow radially outwardly to a pumping channel 218. Accordingly, the precursor gases and its reaction byproducts flow from the center of the showerhead 250 across the surface of the wafer W and toward the periphery of the pedestal 220, and to the pumping channel 218 to be pumped out. The showerhead 250 includes at least one inlet path 252 and has a plurality of holes 254 connected to the inlet path 252, such that the precursor gases provided by an external precursor gas source 202 can flow along the inlet path 252 and emerge from the holes 254.

FIGS. 5A to 5E are local cross-sectional views of the pedestal 220 in FIG. 4 according to some embodiments. The pedestal 220 further includes a top frame 226, a bottom frame 228, and an edge electric field generator 229. The top frame 226 surrounds the top dielectric sheet 222, and the bottom frame 228 surrounds the bottom dielectric sheet 224. The top frame 226 is disposed over the bottom frame 228 and an edge portion of the bottom dielectric sheet 224. The edge electric field generator 229 is disposed at the edge of the top dielectric sheet 222 and/or the bottom dielectric sheet 224 and includes a conductive element 229a and a second DC/AC RF source 229b connected to the conductive element 229a. The conductive element 229a is a wire, a coil, or a conductive plate, and may be made of metal or other suitable materials. In some embodiments, the conductive element 229a is disposed between the top frame 226 and the top dielectric sheet 222 (see FIG. 5A), between the top frame 226 and the bottom dielectric sheet 224 (see FIG. 5B), between the bottom frame 228 and the bottom dielectric sheet 224 (see FIG. 5C), in the top frame 226 (see FIG. 5D), in the bottom frame 228 (see FIG. 5E), or combinations thereof. In FIGS. 5A-5E, the conductive elements 229a are ring-shaped. When a desired voltage is applied to the conductive element 229a from the second DC/AC RF source 229b, an electrical field is formed around the edge of the wafer W, and the plasma distribution above the edge of the wafer W can be adjusted or tuned.

Reference is made to FIG. 4. The sensing module 270 is disposed in the processing chamber 210. In some embodiments, the sensing module 270 is disposed over the edge of the wafer W. For example, the sensing module 270 is fixed on the sidewall 212 of the processing chamber 210 or on the showerhead 250 (FIG. 4). The sensing module 270 is configured to sense a plasma concentration over the edge of the wafer W. In some embodiments, the sensing module 270 is an optical emission spectroscopy (OES). It is noted that the OES is an example, and does not limit the present disclosure.

The control module 280 is electrically connected to the sensing module 270 and the second DC/AC RF source 229b. The control module 280 is configured to control the power of the first DC/AC RF source 260. Furthermore, the control module 280 is further configured to control the power of the second DC/AC RF source 229b according to the plasma concentration detected by the sensing module 270, and the controlling processes will be discussed in more detail below in FIG. 9A.

Figure 6:
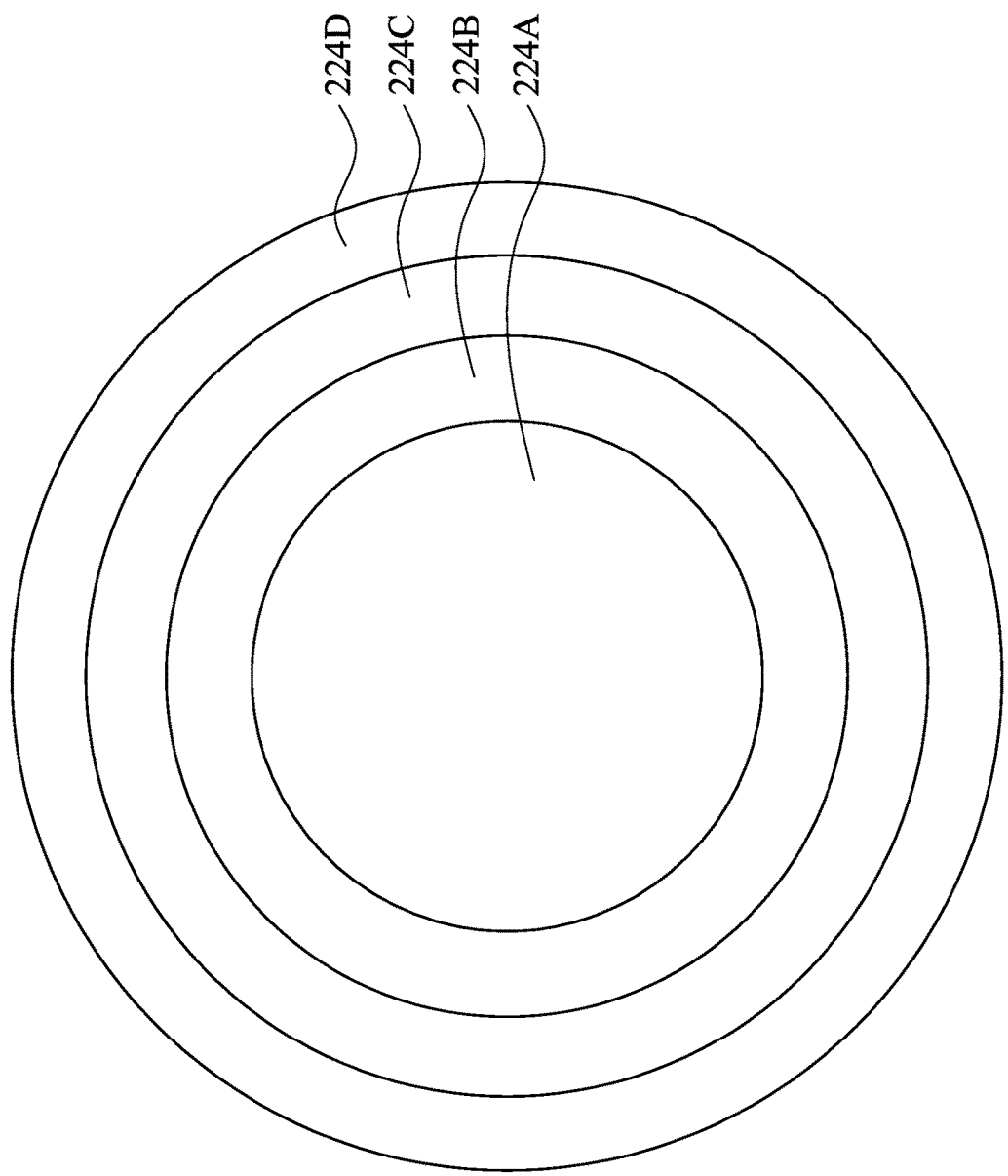
FIG. 6 is a top view of the bottom dielectric sheet of FIG. 4.

FIG. 6 is a top view of the bottom dielectric sheet 224 of FIG. 4. Reference is made to FIGS. 4 and 6. In some embodiments, the bottom dielectric sheet 224 includes plural zones. For example, the bottom dielectric sheet 224 includes an inner zone 224A, a middle zone 224B, an intermediate zone 224C, and an outer zone 224D. The middle zone 224B surrounds the inner zone 224A, the intermediate zone 224C surrounds the middle zone 224B, and the outer zone 224D surrounds the intermediate zone 224C. The zones 224A, 224B, 224C, and 224D are concentric circles. The outer zone 224D is adjacent to the bottom frame 228 (FIGS. 5A-5E). The bottom dielectric sheet 224 (i.e., the inner zones 224A, the middle zone 224B, the intermediate zone 224C, and the outer zone 224D) is connected to the temperature controller 290, which is configured to heat and/or cool the different zones to increase/decrease deposition rates over different zones and adjust the critical dimensions of the wafer W. The temperature controller 290 is further connected to the control module 280, such that the temperature controller 290 controls the temperatures of the inner zones 224A, the middle zone 224B, the intermediate zone 224C, and the outer zone 224 according to the plasma concentration detected by the sensing module 270, and the controlling processes will be discussed in more detail below in FIG. 9B.

FIGS. 7A to 7F illustrate a semiconductor structure at various stages according to some embodiments. In some embodiments, the semiconductor device shown in FIGS. 7A to 7E may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, bipolar transistors, high voltage transistors, high frequency transistors, other memory cells, and combinations thereof.

Figure 7A:
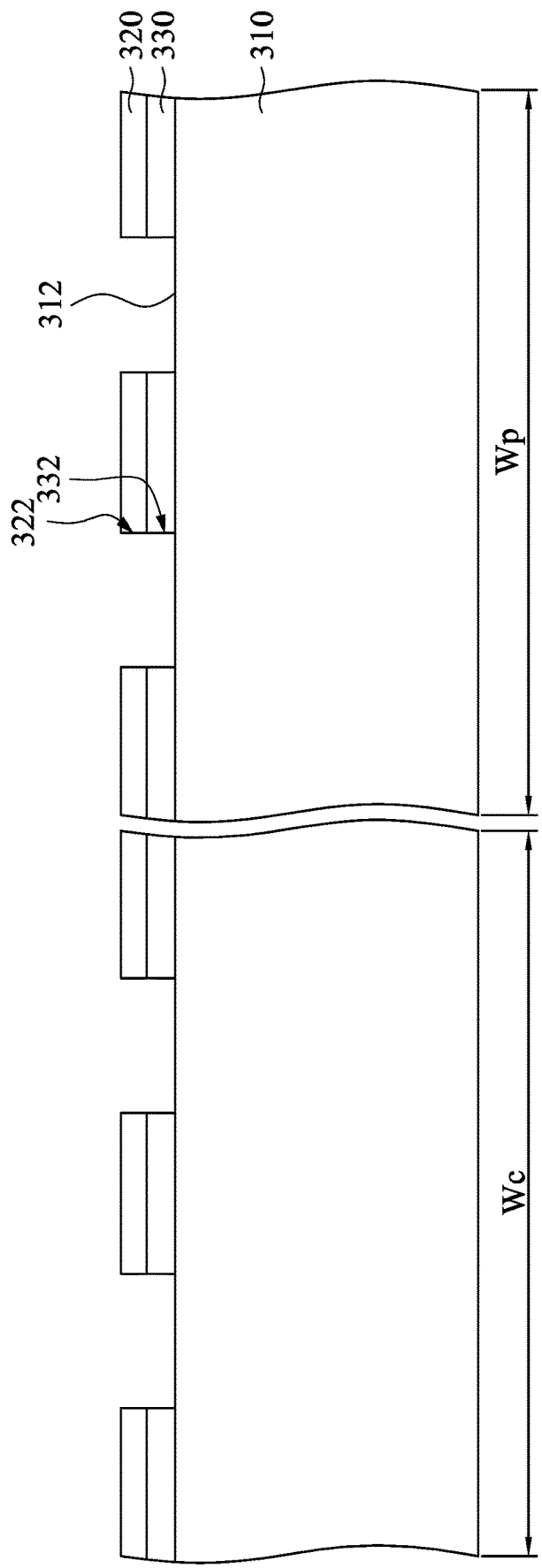
FIGS. 7A to 7F illustrate a semiconductor structure at various stages according to some embodiments.

Reference is made to FIG. 7A. A substrate 310 is provided. The substrate 310 may be a wafer, and has a center region Wc and a peripheral region Wp. For example, the center region Wc is surrounded by the peripheral region Wp. In some embodiment, the center region Wc of the substrate 310 corresponds to the center region Wc of the wafer W in FIGS. 1 and 4, and the peripheral region Wp of the substrate 310 corresponds to the peripheral region Wp of the wafer W. The center region Wc and the peripheral region Wp may be located in different dies of the wafer W.

In some embodiments, the substrate 310 includes silicon. Alternatively, the substrate 310 may include germanium, silicon germanium, gallium arsenide or other appropriate semiconductor materials. Also alternatively, the substrate 310 may include an epitaxial layer. For example, the substrate 310 may have an epitaxial layer overlying a bulk semiconductor. Further, the substrate 310 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 310 may include a semiconductor-on-insulator (SOI) structure. Also alternatively, the substrate 310 may include a buried dielectric layer, such as a buried oxide (BOX) layer, such as that formed by separation by implantation of oxygen (SIMOX) technology, wafer bonding, SEG, or other appropriate method.

A patterned mask layer 320 (may be a hard mask layer) is formed over the top surface 312 of the substrate 310. In some embodiments, the patterned mask layer 320 includes nitride. For example, the mask layer 320 is made of silicon nitride (SiN). However, other materials, such as SiON, silicon carbide, or combinations thereof, may also be used. The mask layer 320 may be formed by a process such as chemical vapor deposition (CVD), plasma enhanced chemical vapor deposition (PECVD), or low pressure chemical vapor deposition (LPCVD). Alternatively, the mask layer 320 may be made of a silicon oxide and then converted to SiN by nitridation.

In some embodiments, a protective layer 330 is formed over the top surface 312 of the substrate 310 and between the mask layer 320 and the substrate 310. The protective layer 330 protects the top surface 312 from direct contact with the mask layer 320. For example, the protective layer 330 can protect active regions formed in the substrate 310. The active regions are used for forming devices (such as transistors, resistors, etc.). Depending upon the devices to be formed, the active regions may include either an n-well or a p-well as determined by the design conditions. In some embodiments, the protective layer 330 is made of a thermal oxide. Once formed, the mask layer 320 and the protective layer 330 are patterned through suitable photolithographic and etching processes to form openings 322 and 332 over the top surface 312.

Figure 7B:
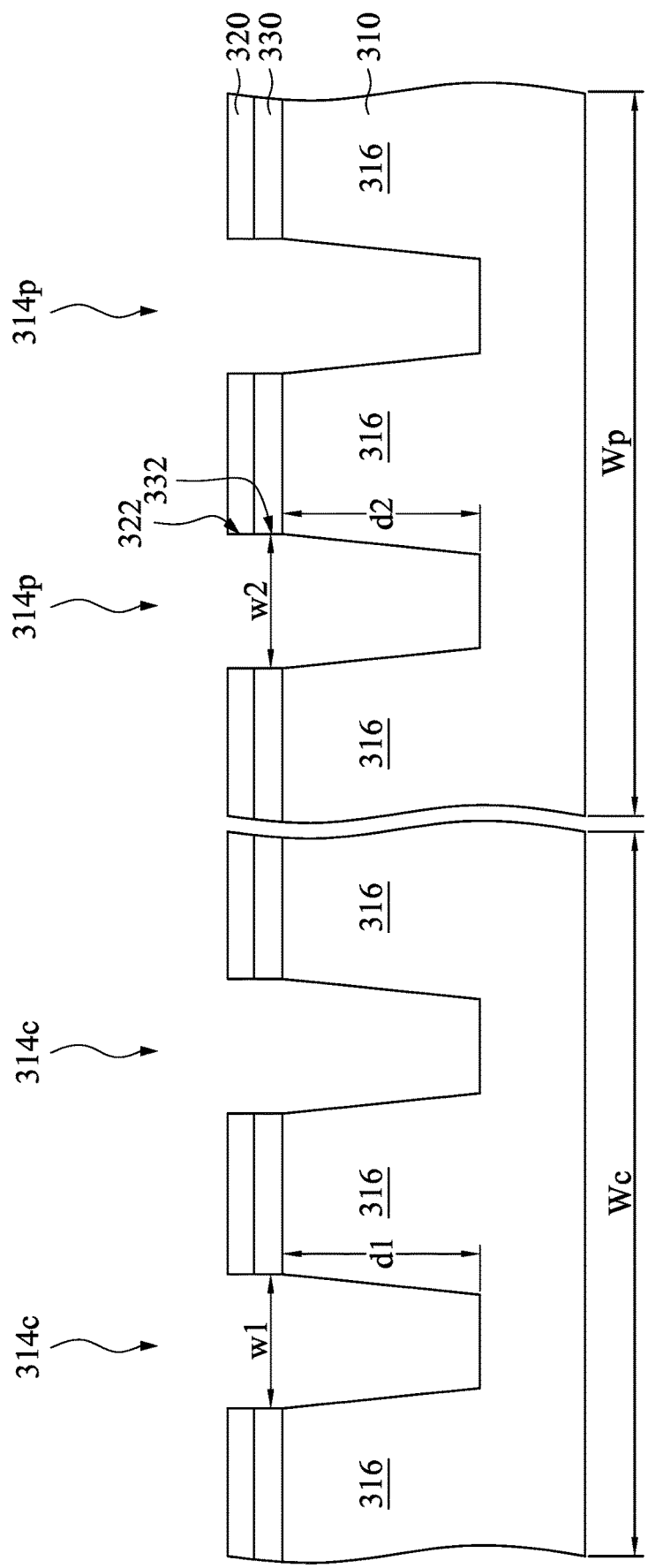

Reference is made to FIG. 7B. Trenches 314c are formed in the center region 302 of the substrate 310, and the trenches 314p are formed in the peripheral region 304 of the substrate 310. The exposed portions of the substrate 310 through the openings 322 and 332 of FIG. 7A are removed by an etching process, such as reactive ion etching (RIE), in order to form the trenches 314c and 314p in the substrate 310. In some embodiments, at least one of the trenches 314c has a width w1 and a depth d1, and at least one of the trenches 314p has a width w2 and a depth d2. An aspect ratio, the depth d1 (d2) (sometimes referred to herein as trench height) divided by the width w1 (w2), of the trench 314c and 314p may be in a range from about 1 to about 18. It is noted that the dimensions and values recited throughout the descriptions are examples, and may be changed to suit different scales of semiconductor devices.

In some embodiments, the semiconductor device is a fin field effect transistor (FinFET), and the trenches 314c and 314p are configured to separate adjacent two semiconductor fins 316 formed in the substrate 310. In other words, one of the semiconductor fins 316 is between adjacent two of the trenches 314c (or 314p).

Figure 8A:
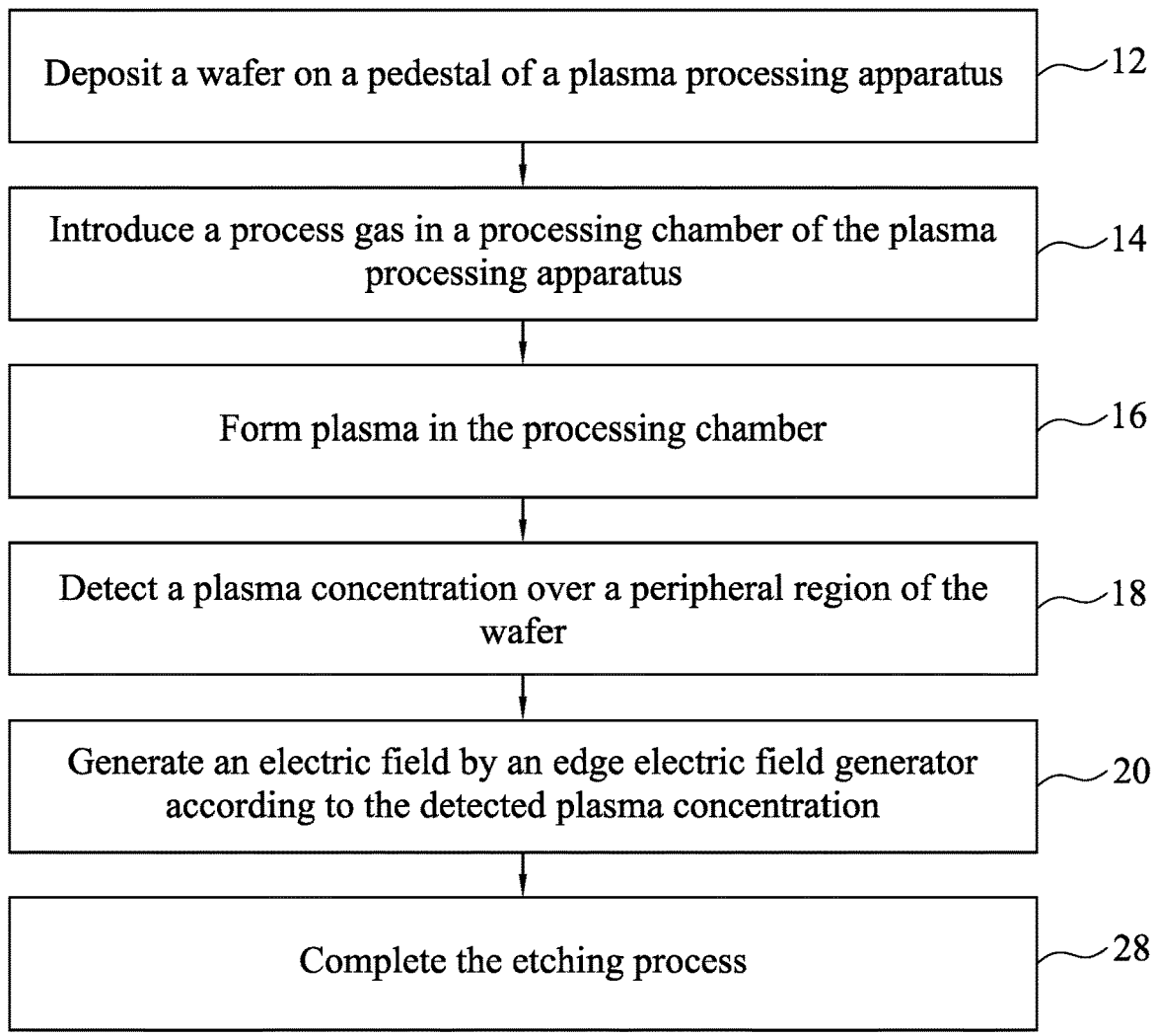
FIG. 8A is a flow chart of a method of an etching process in accordance with some embodiments of the present disclosure.

Illustrated in FIG. 8A is a flow chart of a method M10 of an etching process in accordance with some embodiments of the present disclosure. Reference is made to FIGS. 1, 7B, and 8A. In some embodiments, the substrate 310 may be etched in the plasma processing apparatus 100 of FIG. 1 and using the method M10 of FIG. 8A. In some embodiments, the substrate 110 (referred to as the wafer W in this case) is deposited on the pedestal 120 of the plasma processing apparatus 100 as shown in block 12 of FIG. 8A. The first DC/AC RF source 160 may provide a desired voltage to the pedestal 120, and the wafer W is attracted on the pedestal 120.

The method M10 proceeds to block 14 where a process gas is introduced in the processing chamber 110. Reference is made to FIG. 1. In some embodiments, the process gas may be chlorine ($Cl_2$), hydrogen bromide (HBr), tetrafluoromethane ($CF_4$), oxygen ($O_2$), nitrogen ($N_2$), or other suitable gases. The type of the process gas depends on the materials desired to be etched.

The method M10 proceeds to block 16 where plasma is formed in the processing chamber 110. Reference is made to FIG. 1. In some embodiments, the first DC/AC RF source 160 generates RF electromagnetic field to convert the process gas between the top electrode 150 and the pedestal 120 into plasma P for etching the wafer W.

In some embodiments, during an etching process, the plasma P not only etches the materials on the wafer W, but also etches the top frame 126 since the top frame 126 is exposed to the plasma P. If the top frame 126 is etched by the plasma P, the outer surfaces of the top frame 126 may be non-flat (become rougher). As such, the RF electromagnetic field around the etched portion of the top frame 126 may be different from the RF electromagnetic field over the center portion Wc of the wafer W. This non-uniform RF electromagnetic field distribution produces non-uniform plasma distribution in the processing chamber 110. For example, the concentration of the plasma P over the center portion Wc of the wafer W is lower than the concentration of the plasma P over the peripheral portion Wp of the wafer W, and the etching rate regarding the peripheral portion Wp will be higher than the etching rate regarding the center portion Wc, and/or the etching direction regarding the peripheral portion Wp will be different from the etching direction regarding the center portion Wc.

The present disclosure solves issues in existing approaches by controlling the RF electromagnetic field over the peripheral region Wp of the wafer W (i.e., over the top frame 126). The method M10 proceeds to block 18 where a plasma concentration over the peripheral region of the wafer (i.e., over the top frame) is detected. In some embodiments, after the plasma P is formed in the processing chamber 110, the sensing module 170 detects the plasma concentration over the top frame 126. The detecting details are described above, and are not repeated herein.

The method M10 proceeds to block 20 where an electric field is generated by the edge electric field generator according to the detected plasma concentration. Specifically, the plasma concentration detected by the sensing module 170 is compared with a predetermined plasma concentration, which may be an initial plasma concentration over the top frame 126 of a new processing chamber 110, a plasma concentration over the top frame 126 with flat surfaces, or the plasma concentration over the center portion Wc of the wafer W. If the detected plasma concentration is different from the predetermined plasma concentration, the second DC/AC RF source 129b produces a voltage to the conductive element 129a, and an additional electric field is generated over the top frame 126. This additional electric field adjusts the plasma distribution over the top frame 126. As such, the plasma concentration over the peripheral region Wp (or over the top frame 126) can be modified to be similar to (or the same) as the plasma concentration over the center region Wc.

In some embodiments, if the detected plasma concentration is higher than the predetermined plasma concentration, the second DC/AC RF source 129b may produce a negative bias to the conductive element 129a to produce a first electric field over the peripheral region Wp (or over the top frame 126). If the detected plasma concentration is lower than the predetermined plasma concentration, the second DC/AC RF source 129b may produce a negative bias to the conductive element 129b to produce a second electric field over the peripheral region Wp (or over the top frame 126).

In some embodiments, the control module 180 may include a machining learning module, which may store the relationship between the detected plasma concentration (or the difference between the detected plasma concentration and the predetermined plasma concentration) and the desired voltage/bias value of the second DC/AC RF source 129b. After the relationship database is built, the second DC/AC RF source 129b can provide the desired voltage/bias to the conductive element 129a when the detected plasma concentration is detected according to the database. In some other embodiments, the machining learning module of the control module 180 may collect the data of plural plasma processing apparatuses 100 in the same lab or the same factory to build a huge database, improving the accuracy of the voltage/bias values.

In some embodiments, the detecting process may be a real time detecting process. That is, the sensing module 170 continuously detects the plasma concentration over the top frame 126 during the etching process (i.e., the blocks 18 and 20 are proceeded more than once). If the plasma concentration over the top frame 126 is over-increased, the second DC/AC RF source 129b decreases the value of the bias, such that the electric field over the peripheral region Wp (or over the top frame 126) is decreased, and the plasma concentration over the top frame 126 is decreased. In contrary, if the plasma concentration over the top frame 126 is over-decreased, the second DC/AC RF source 129b increases the value of the bias, such that the electric field over the peripheral region Wp (or over the top frame 126) is increased, and the plasma concentration over the top frame 126 is increased.

With such operations, the plasma concentration over the top frame 126 is adjusted/tuned. As such, the etching rate regarding the peripheral portion Wp may be substantially the same as the etching rate regarding the center portion Wc, and the etching direction regarding the peripheral portion Wp may be substantially the same as the etching direction regarding the center portion Wc. The trenches 314c and 314p thus have similar or the same profiles with this process. For example, the depth d1 of the trench 314c is substantially the same as the depth d2 of the trench 314p.

The method M10 proceeds to block 28 where the etching process is completed. In some embodiments, after the etching process is finished, the first DC/AC RF source 180, the second DC/AC RF source 129b, and the control module 180 are turned off, and the wafer W is taken out of the processing chamber 110 and proceeds the following manufacturing processes.

Figure 8B:
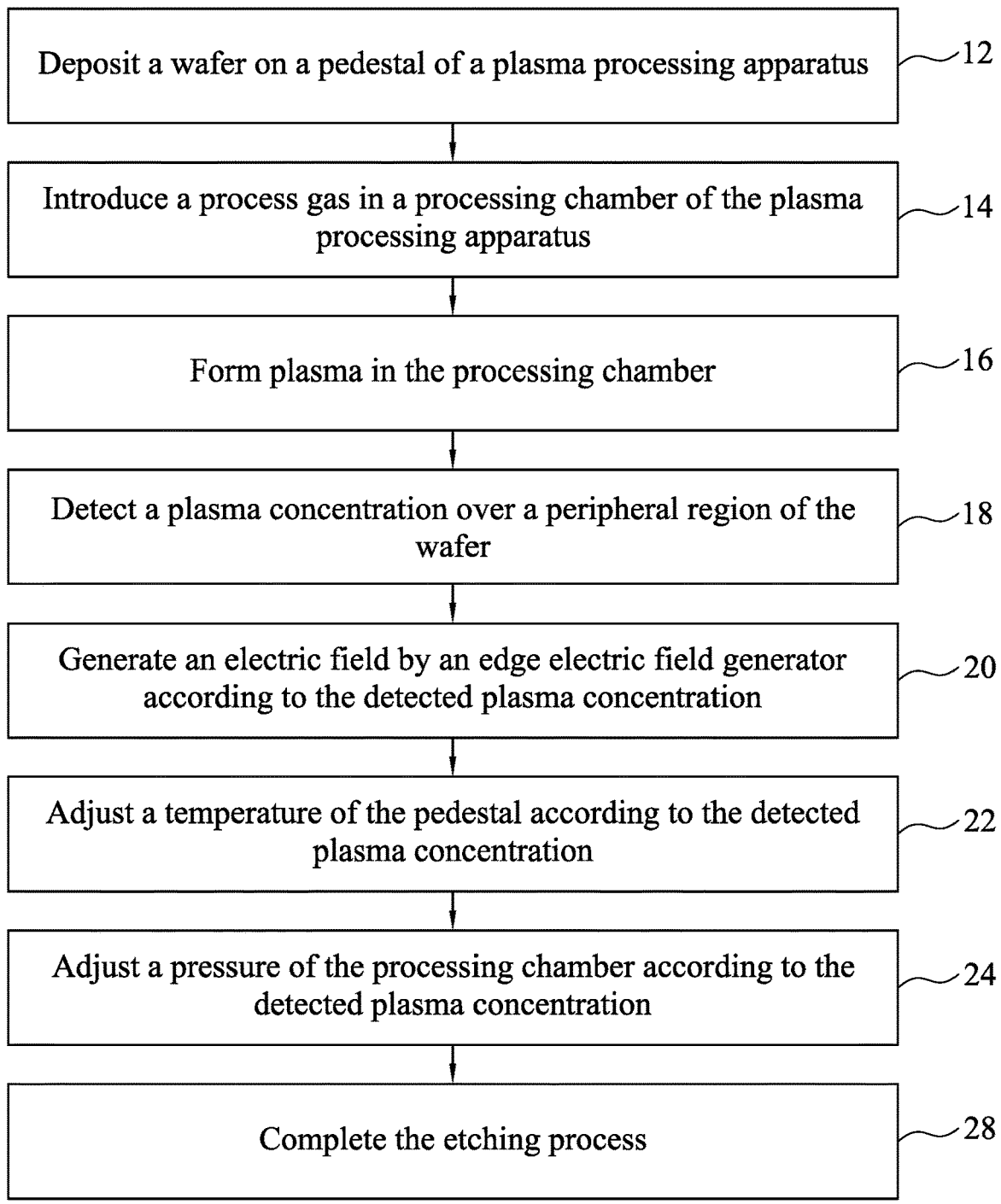
FIG. 8B is a flow chart of a method of an etching process in accordance with some embodiments of the present disclosure.

Illustrated in FIG. 8B is a flow chart of a method M10' of an etching process in accordance with some embodiments of the present disclosure. Reference is made to FIGS. 1, 7B, and 8B. The method M10' is the same as or similar to the method M10 except the additional blocks 22 and 24. In some embodiments, the method M10' proceeds to block 22 where a temperature of the pedestal 120 is adjusted according to the detected plasma concentration. Specifically, a higher temperature increases the etching rate and amount etched, whereas a lower temperature decreases the etching rate and the amount etched. The temperature controller 190 may adjust the temperature of the outer zone 124D of the bottom dielectric sheet 124 to adjust the etching rate regarding the peripheral region Wp. For example, if the detected plasma concentration is higher than the predetermined plasma concentration, the temperature controller 190 may decrease the temperature of the outer zone 124D to reduce the etching rate over the peripheral region Wp. In contrary, if the detected plasma concentration is lower than the predetermined plasma concentration, the temperature controller 190 may increase the temperature of the outer zone 124D to raise the etching rate over the peripheral region Wp.

In some other embodiments, the method M10' proceeds to block 24 where a pressure of the processing chamber 110 is adjusted according to the detected plasma concentration. Specifically, a higher pressure (of the process gas or the plasma) increases the etching rate and amount etched, whereas a lower pressure decreases the etching rate and the amount etched. The control module 180 may adjust the pressure of the flow rate of the process gas in the external process gas source 102 to adjust the overall etching rate. For example, if the detected plasma concentration is higher than the predetermined plasma concentration, the control module 180 may decrease the flow rate of the process gas to reduce the overall etching rate. In contrary, if the detected plasma concentration is lower than the predetermined plasma concentration, the control module 180 may increase the flow rate of the control module 180 to raise the overall etching rate. It is noted that the blocks 22 or 24 may be omitted in some embodiments. The blocks 22 and/or 24 may be performed before, during, or after the block 20, and the present disclosure is not limited in these embodiments.

Figure 7C:
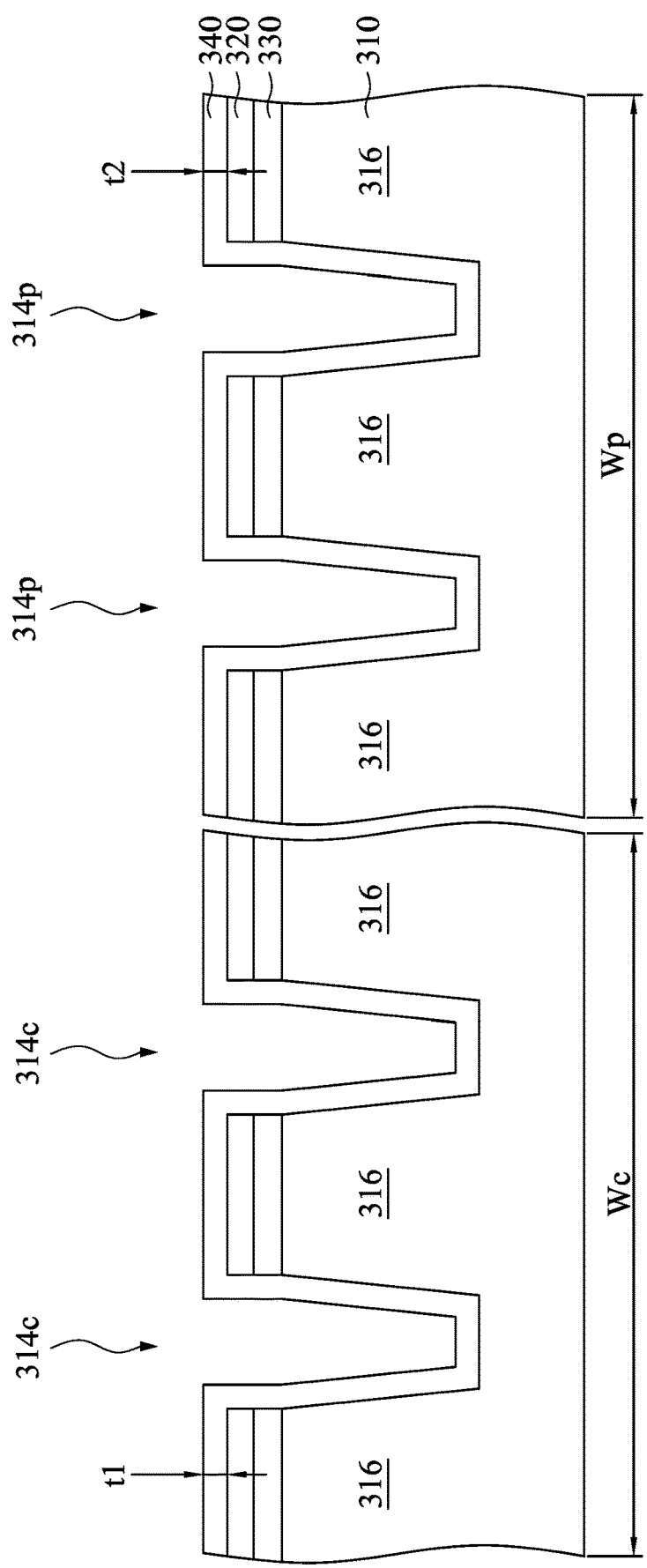

Reference is made to FIG. 7C. A liner layer 340 is conformally formed over the structure of FIG. 7B, that is, on the trenches 314c and 314p. The liner layer 340 is formed using a deposition technique that can form conformal dielectric layers, such as thermal atomic layer deposition (ALD), plasma-enhanced (PE) ALD, pulsed PEALD, atomic layer chemical vapor deposition (AL-CVD), or PECVD.

Figure 9A:
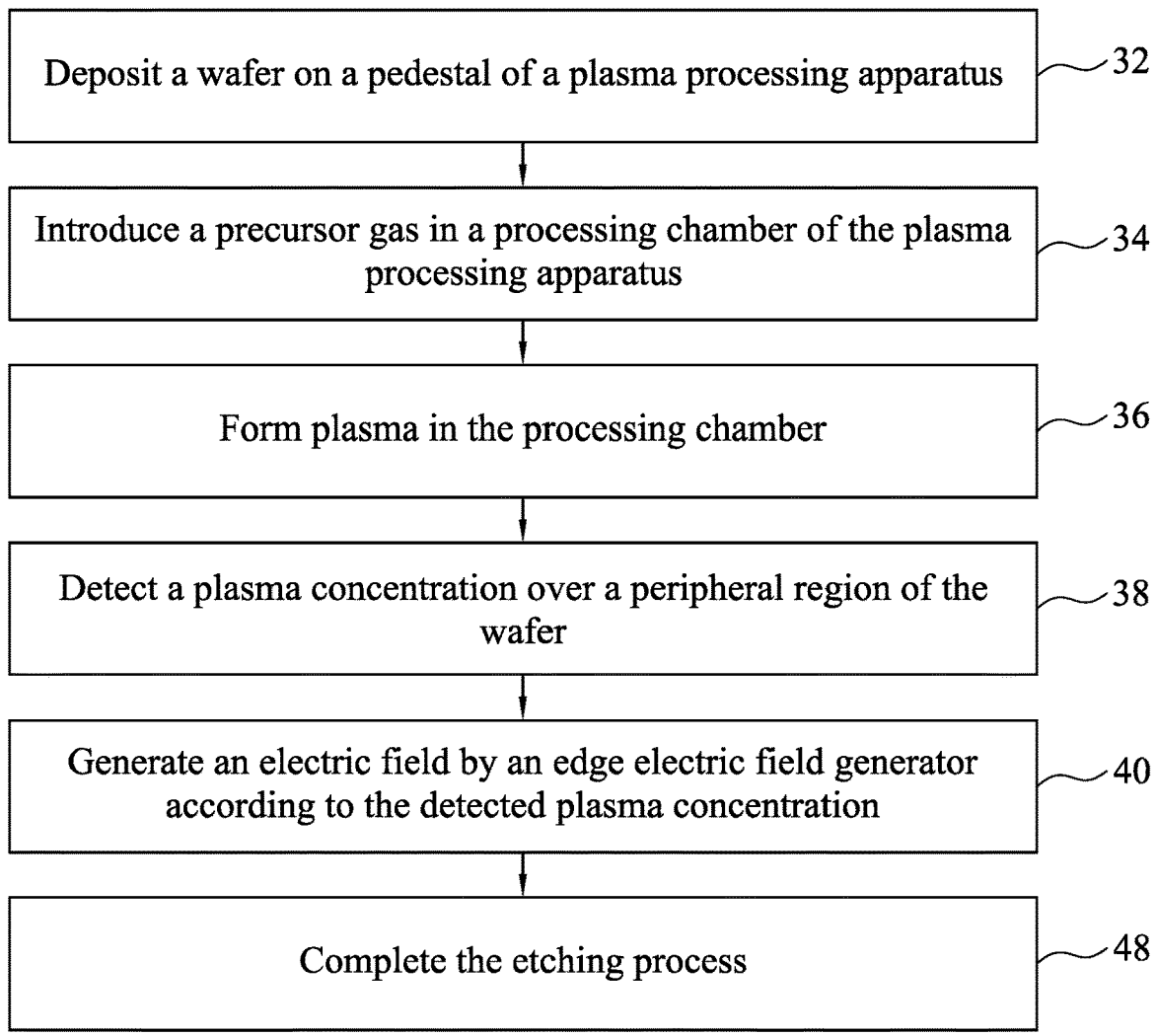
FIG. 9A is a flow chart of a method of a deposition process in accordance with some embodiments of the present disclosure.

Illustrated in FIG. 9A is a flow chart of a method M30 of a deposition process in accordance with some embodiments of the present disclosure. Reference is made to FIGS. 4, 7C, and 9A. For the case that the liner layer 340 is formed by using the PECVD, the liner layer 340 may be formed in the plasma processing apparatus 200 of FIG. 4 and using the method M30 of FIG. 9A. In some embodiments, the substrate 310 (referred to as the wafer W in this case) is deposited on the pedestal 220 of the plasma processing apparatus 200 as shown in block 32 of FIG. 9A. The first DC/AC RF source 260 may provide a desired voltage to the pedestal 220, and the wafer W is attracted on the pedestal 220.

The method M30 proceeds to block 34 where a precursor gas is introduced in the processing chamber 210. Reference is made to FIG. 4. In some embodiments, silicon-containing precursors (e.g., $Si_2H_6$, $SiH_4$, $Si_3H_8$, $SiCl_2H_2$, $SiCl_3H$, or other suitable precursors) are introduced in the processing chamber 210, and the present disclosure is not limited in this respect.

The method M30 proceeds to block 36 where plasma is formed in the processing chamber 210. Reference is made to FIG. 4. In some embodiments, the first DC/AC RF source 260 generates RF electromagnetic field to convert the precursor gas between the showerhead 250 and the pedestal 220 into plasma P for depositing the liner layer 340 over the wafer W.

In some embodiments, during a deposition process, the materials are not only deposited on the wafer W, but also deposited on the top frame 226 since the top frame 226 is exposed to the plasma P. If the materials are deposited on the top frame 226, the outer surfaces of the top frame 226 may be non-flat (become rougher). As such, the RF electromagnetic field around the deposited portion of the top frame 226 may be different from the RF electromagnetic field over the center portion Wc of the wafer W. This non-uniform RF electromagnetic field distribution produces non-uniform plasma distribution in the processing chamber 210. For example, the concentration of the plasma P over the center portion Wc of the wafer W is lower than the concentration of the plasma P over the peripheral portion Wp of the wafer W, and the deposition rate regarding the peripheral portion Wp will be higher than the deposition rate regarding the center portion Wc, and/or the deposition direction regarding the peripheral portion Wp will be different from the deposition direction regarding the center portion Wc.

The present disclosure solves issues in existing approaches by controlling the RF electromagnetic field over the peripheral region Wp of the wafer W (i.e., over the top frame 226). The method M30 proceeds to block 38 where a plasma concentration over the peripheral region of the wafer (i.e., over the top frame) is detected. In some embodiments, after the plasma P is formed in the processing chamber 210, the sensing module 270 senses the plasma concentration over the top frame 226. The detecting details are described above, and are not repeated herein.

The method M30 proceeds to block 40 where an electric field is generated by the edge electric field generator according to the detected plasma concentration. Specifically, the plasma concentration detected by the sensing module 270 is compared with a predetermined plasma concentration, which may be an initial plasma concentration over the top frame 226 of a new processing chamber 210, a plasma concentration over the top frame 226 with flat surfaces, or the plasma concentration over the center portion Wc of the wafer W. If the detected plasma concentration is different from the predetermined plasma concentration, the second DC/AC RF source 229b produces a desired voltage to the conductive element 229a, and an additional electric field is generated over the top frame 226. This additional electric field adjusts the plasma distribution over the top frame 226. As such, the plasma concentration over the peripheral region Wp (or over the top frame 226) can be modified to be similar to (or the same) as the plasma concentration over the center region Wc.

In some embodiments, if the detected plasma concentration is higher than the predetermined plasma concentration, the second DC/AC RF source 229b may produce a negative bias to the conductive element 229a to produce a first electric field over the peripheral region Wp (or over the top frame 226). If the detected plasma concentration is lower than the predetermined plasma concentration, the second DC/AC RF source 229b may produce a negative bias to the conductive element 129a to produce a second electric field over the peripheral region Wp (or over the top frame 226).

In some embodiments, the control module 280 may include a machining learning module, which may store the relationship between the detected plasma concentration (or the difference between the detected plasma concentration and the predetermined plasma concentration) and the desired voltage/bias value of the second DC/AC RF source 229b. After the relationship database is built, the second DC/AC RF source 229b can provide the desired voltage/bias to the conductive element 229a when the detected plasma concentration is detected according to the database. In some other embodiments, the machining learning module of the control module 280 may collect the data of plural plasma processing apparatuses 200 in the same lab or the same factory to build a huge database, improving the accuracy of the voltage/bias values.

In some embodiments, the detecting process may be a real time detecting process. That is, the sensing module 270 continuously detects the plasma concentration over the top frame 226 during the deposition process (i.e., the blocks 38 and 40 are proceeded more than once). If the plasma concentration over the top frame 226 is over-increased, the second DC/AC RF source 229b decreases the value of the bias, such that the electric field over the peripheral region Wp (or over the top frame 226) is decreased, and the plasma concentration over the top frame 226 is decreased. In contrary, if the plasma concentration over the top frame 226 is over-decreased, the second DC/AC RF source 229b increases the value of the bias, such that the electric field over the peripheral region Wp (or over the top frame 226) is increased, and the plasma concentration over the top frame 226 is increased.

With such operations, the plasma concentration over the top frame 226 is adjusted/tuned. As such, the deposition rate regarding the peripheral portion Wp may be substantially the same as the deposition rate regarding the center portion Wc, and the deposition direction regarding the peripheral portion Wp may be substantially the same as the deposition direction regarding the center portion Wc. The liner layer 340 over the center region Wc of the substrate 310 and the liner layer 340 over the peripheral region Wp of the substrate 310 have the same or similar profile (or thickness). For example, the thickness t1 of the liner layer 340 over the center region Wc is substantially the same as the thickness t2 of the liner layer 340 over the peripheral region Wp.

The method M30 proceeds to block 48 where the deposition process is completed. In some embodiments, after the deposition process is finished, the first DC/AC RF source 280, the second DC/AC RF source 229b, and the control module 280 are turned off, and the wafer W is taken out of the processing chamber 210 and proceeds the following manufacturing processes.

Figure 9B:
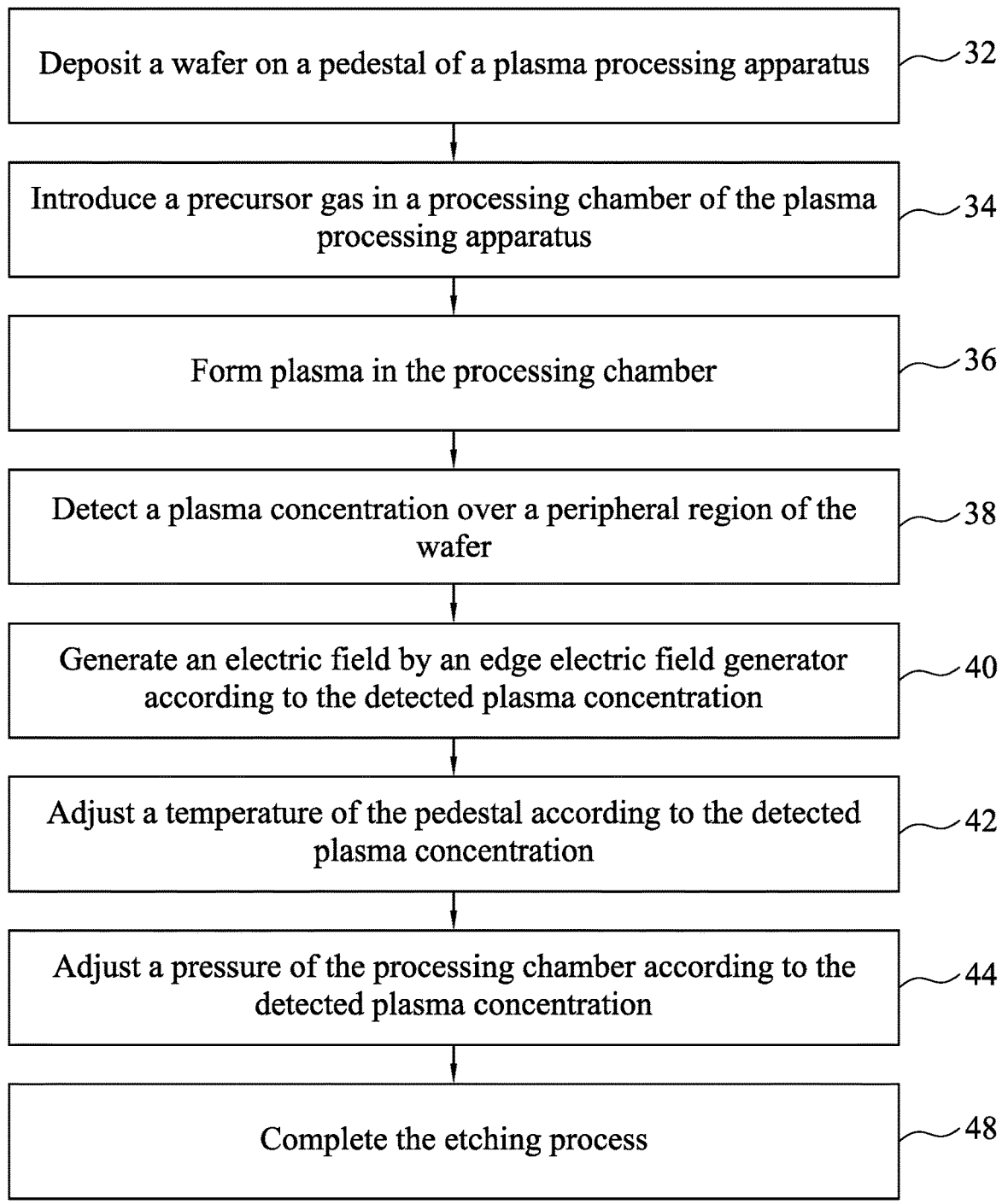
FIG. 9B is a flow chart of a method of a deposition process in accordance with some embodiments of the present disclosure.

Illustrated in FIG. 9B is a flow chart of a method M30' of a deposition process in accordance with some embodiments of the present disclosure. Reference is made to FIGS. 4, 7C, and 9B. The method M30' is the same as or similar to the method M30 except the additional blocks 42 and 44. In some embodiments, the method M30' proceeds to block 42 where a temperature of the pedestal 220 is adjusted according to the detected plasma concentration. Specifically, a higher temperature increases the deposition rate and amount deposited, whereas a lower temperature decreases the deposition rate and the amount deposited. The temperature controller 290 may adjust the temperature of the different zones of the bottom dielectric sheet 124 to adjust the deposition rate regarding different regions. For example, the temperature controller 290 may provide the same temperature value to the four zones 124A, 124B, 124C, and 124D in the beginning of the deposition process. Then, after the sensing module 270 senses the plasma concentration over the top frame 226, the temperature controller 290 adjusts the temperature of the outer zone 124D. Specifically, if the detected plasma concentration is higher than the predetermined plasma concentration, the temperature controller 290 may decrease the temperature of the outer zone 124D to reduce the deposition rate over the peripheral region Wp. In contrary, if the detected plasma concentration is lower than the predetermined plasma concentration, the temperature controller 290 may increase the temperature of the outer zone 124D to raise the deposition rate over the peripheral region Wp.

In some other embodiments, the method M30' proceeds to block 44 where a pressure of the processing chamber 210 is adjusted according to the detected plasma concentration. Specifically, a higher pressure (of the process gas or the plasma) increases the deposition rate and amount deposited, whereas a lower pressure decreases the deposition rate and the amount deposited. The control module 280 may adjust the pressure of the flow rate of the process gas in the external process gas source 102 to adjust the overall deposition rate. For example, if the detected plasma concentration is higher than the predetermined plasma concentration, the control module 280 may decrease the flow rate of the process gas to reduce the overall deposition rate. In contrary, if the detected plasma concentration is lower than the predetermined plasma concentration, the control module 280 may increase the flow rate of the control module 280 to raise the overall deposition rate. It is noted that the blocks 42 or 44 may be omitted in some embodiments. The blocks 42 and/or 44 may be performed before, during, or after the block 40, and the present disclosure is not limited in these embodiments.

Figure 7D:
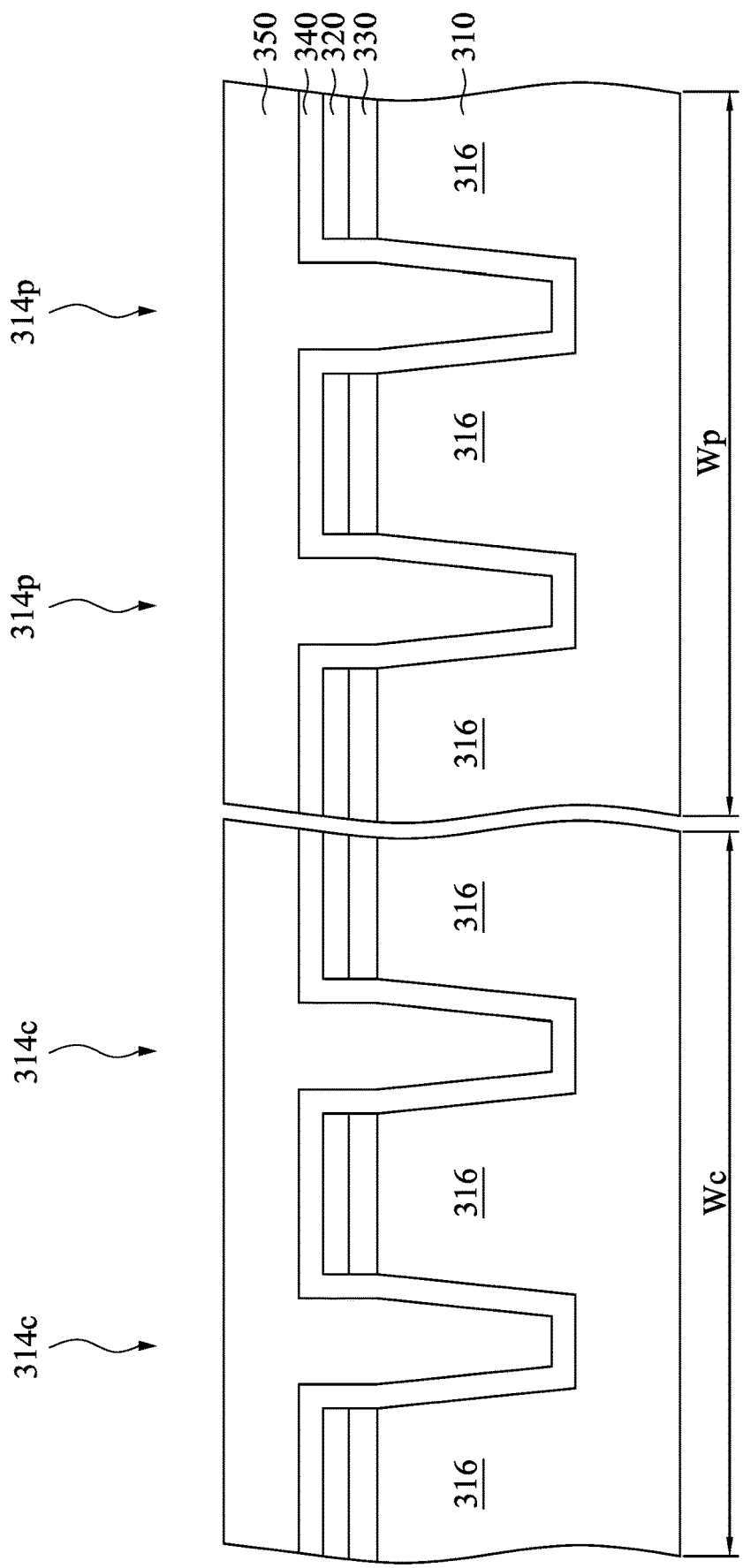

Reference is made to FIG. 7D. A dielectric material 350 is formed over the structure of FIG. 7C (i.e., over the liner layer 340) and filling the trenches 314c and 314p by performing a deposition process. The dielectric material 350 is formed using a deposition technique that can form a filling dielectric material, such as thermal chemical vapor deposition (CVD), PECVD, or remote-PEALD. If the dielectric material 350 is formed using a plasma process (such as PECVD or PEALD), the dielectric material 350 may be formed according to the method M30 or M30' as mentioned above, and the details are not repeated herein.

Figure 7E:
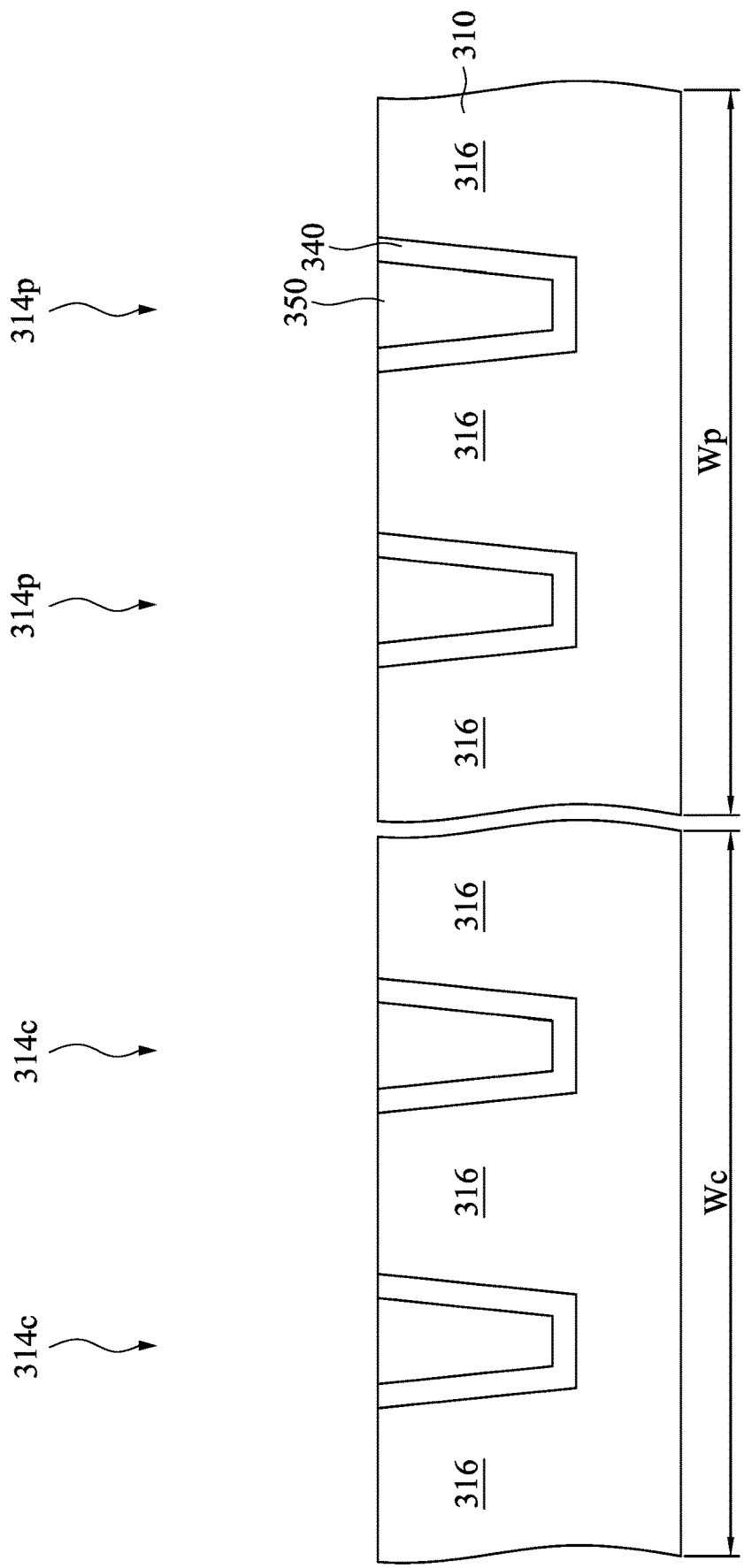

Reference is made to FIG. 7E. A planarization process is performed to remove the liner layer 340 and the dielectric material 350 outside the trenches 314c and 314p. In some embodiments, the planarization process is a chemical-mechanical polishing (CMP) process. In some embodiments, the planarization process also removes the mask layer 320 and the protective layer 330 (see FIG. 7D).

Figure 7F:
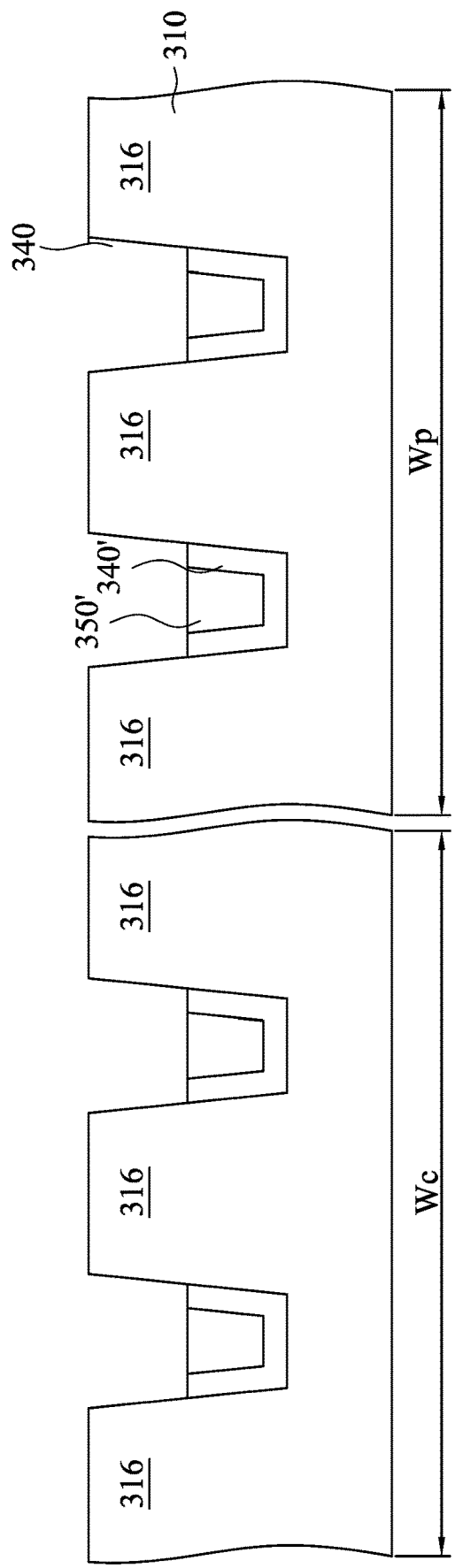

Reference is made to FIG. 7F. The planarized liner layer 340 and the dielectric material 350 of FIG. 7E are recessed to respectively form liner layers 340' and isolation materials 350', and the semiconductor fins 316 are protruded from the liner layers 340' and the isolation materials 350'. The liner layers 340' respectively wrap the isolation materials 350'. In some embodiments, the liner layers 340' and isolation materials 350' are together referred to as shallow trench isolations (STI).

FIG. 10A is a schematic view of a top frame of the pedestal 120 of FIG. 1 according to some embodiments. In some embodiments, instead of generating an electric field at the edge of the wafer W, the top frame may be designed to adjust the local plasma distribution. Specifically, in FIGS. 1 and 2A, the top electrode 150, the conductive sheet 125, and the top frame 126 form a capacitor, where the top frame 126 acts as a dielectric material between two electrodes of the capacitor. As such, the electric field can be adjusted by changing the material of the top frame 126.

In the embodiment of FIG. 10A, the top frame 126 includes a first portion 126a and a second portion 126b. The first portion 126a surrounds the second portion 126b and they are concentric circles. The first and second portions 126a and 126b have different band gaps, so they have different dielectric constants. A higher band gap induces lower electric field, and the etching rate and amount etched are reduced. On contrary, a lower band gap induces higher electric field, and the etching rate and the amount etched are increased. If the first portion 126a has a higher band gap than the second portion 126b, the plasma concentration is gradually decreased outwardly. On contrary, if the first portion 126a has a lower band gap than the second portion 126b, the plasma concentration is gradually increased outwardly. In some embodiments, the high band gap material may be have a band gap higher than about 5, such as $SiO_2$, $Al_2O_3$, or $ZrO_2$, and the low band gap material may be have a band gap lower than about 5, such as $Si_3N_4$, $Y_2O_3$, $TiO_2$, or $HfO_2$.

FIGS. 10B and 10C are cross-sectional views of the line A-A in FIG. 10A according to some embodiments. In some embodiments, the first portion 126a may be coated on the second portion 126b as shown in FIG. 10B; in some other embodiments, the first and second portions 126a and 126b may be rings with the same height and adhered together as shown in FIG. 10C.

The top frame 126 may be designed according to the desired plasma distribution. For example, if the initial plasma distribution is gradually increased outwardly, the top frame 126 in FIG. 10A (when the first portion 126a has a higher band gap than the second portion 126b) can be disposed in the processing chamber 110. Since the top frame 126 in FIG. 10A makes the plasma concentration gradually decrease outwardly, the resulting plasma concentration may become uniform, and the etching performance can be improved.

Figure 10D:
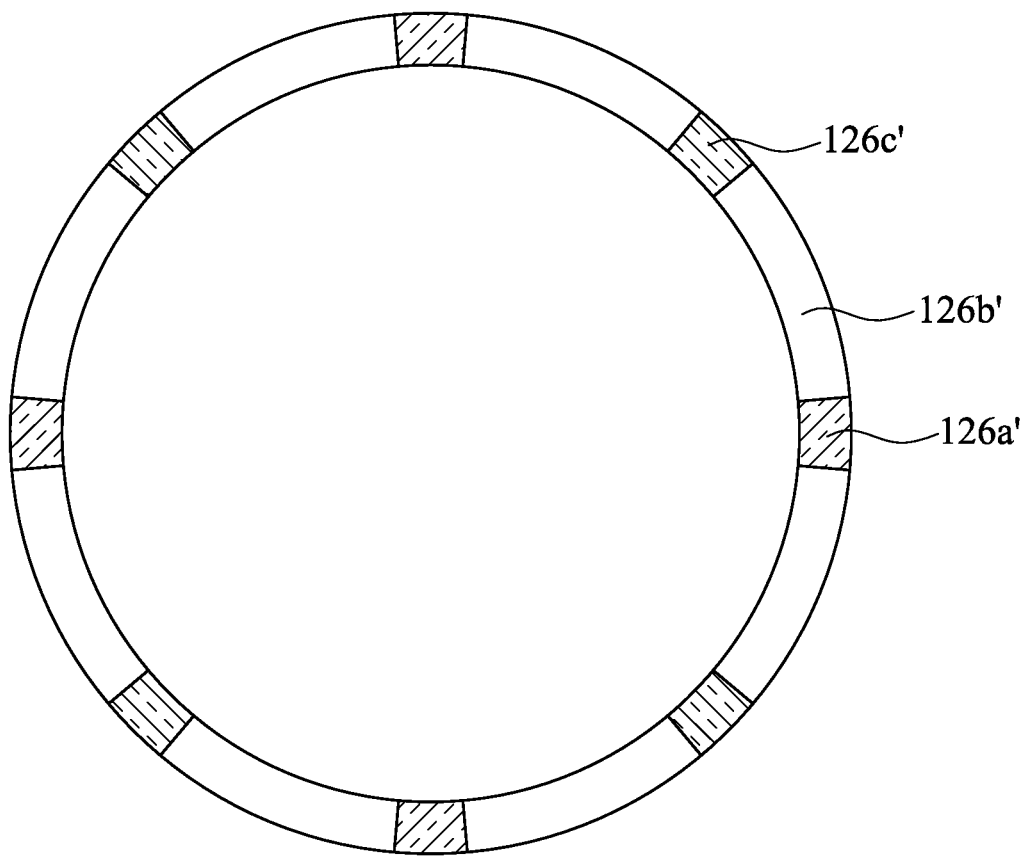
FIG. 10D is a schematic view of a top frame of the pedestal of FIG. 1 according to some embodiments.

FIG. 10D is a schematic view of a top frame of the pedestal 120 of FIG. 1 according to some embodiments. The top frame 126 includes a first portion 126a', a second portion 126b', and a third portion 126c'. The first, second, and third portions 126a', 126b', and 126c' are sectors and alternatively arranged as a circle. The first, second, and third portions 126a', 126b', and 126c' have different band gaps, so they have different dielectric constants. For example, the top frame 126 may be designed according to the desired plasma distribution. In some embodiments, the first and third portions 126a' and 126c' may be coated on the second portion 126b', or the first, second, and third portions 126a', 126b', and 126c' may have the same heights and are adhered together.

Figure 11:
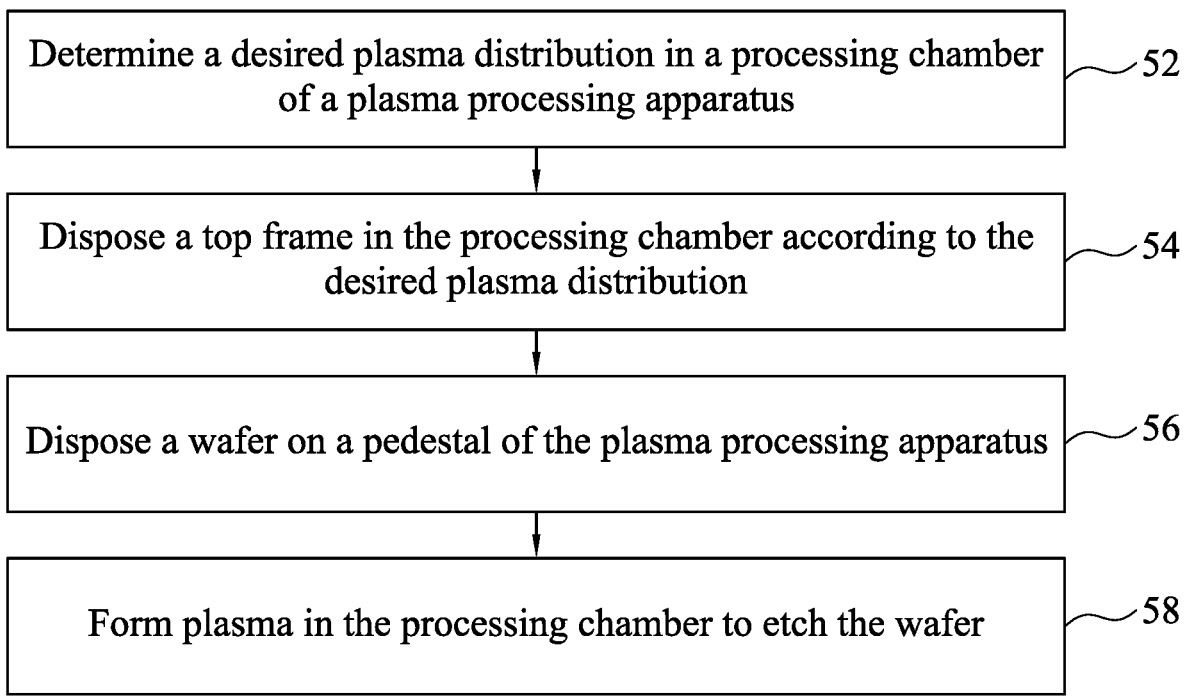
FIG. 11 is a flow chart of a method of an etching process in accordance with some embodiments of the present disclosure.

FIG. 11 is a flow chart of a method M50 of an etching process in accordance with some embodiments of the present disclosure. The method M50 may be used in the etching process in FIG. 7B. Reference is made to FIGS. 1, 7B, and 11. In block 52, a desired plasma distribution in the processing chamber 110 is determined. In some embodiments, the initial plasma distribution of the plasma processing apparatus 100 is not uniform, and the desired plasma distribution is a uniform plasma distribution. In some other embodiments, the patterns over the wafer W have different heights in different regions (e.g., the patterns in the center region Wc are higher than the patterns in the peripheral region Wp). When the desired plasma distribution is non-uniform (e.g., the plasma concentration over the center region Wc is higher than the plasma concentration over the peripheral region Wp), the resulting etched patterns in deferent regions may have the same heights.

In block 54, a top frame is disposed in the processing chamber 110 according to the desired plasma distribution. Specifically, once the desired plasma distribution is determined, the electric field adjustment around the edge of the wafer W is determined. Then, a corresponding top frame that can induce the desired plasma distribution is chosen to be deposited in the processing chamber 110. In some embodiments, the corresponding top frame may be the top frames 126 in FIG. 10A or 10D.

In block 56, the wafer W is disposed on the pedestal 120, and the top frame 126 surrounds the wafer W. The first DC/AC RF source 160 may provide a desired voltage to the pedestal 120, and the wafer W is attracted on the pedestal 120.

In block 58, plasma P is formed in the processing chamber 110 to etch the wafer W. Since the formation details of the plasma P is described above, a description is omitted herein.

With such operations, the plasma concentration over the top frame 126 is adjusted/tuned. As such, the trenches 314c and 314p thus have similar or the same profiles with this process. For example, the depth d1 of the trench 314c is substantially the same as the depth d2 of the trench 314p.

Figure 12A:
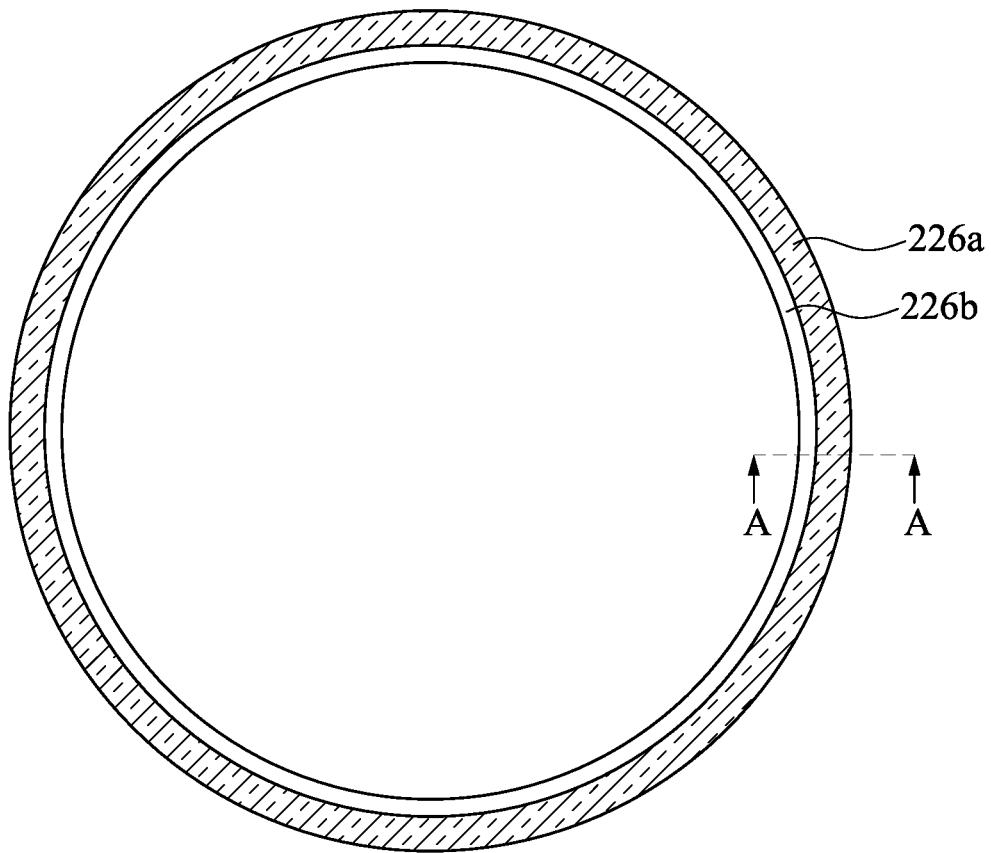
FIG. 12A is a schematic view of a top frame of the pedestal of FIG. 4 according to some embodiments.

FIG. 12A is a schematic view of a top frame of the pedestal 220 of FIG. 4 according to some embodiments. In some embodiments, instead of generating an electric field at the edge of the wafer W, the top frame may be designed to adjust the local plasma distribution. Specifically, in FIGS. 4 and 5A, the showerhead 250, the conductive sheet 225, and the top frame 226 form a capacitor, where the top frame 226 acts as a dielectric material between two electrodes of the capacitor. As such, the electric field can be adjusted by changing the material of the top frame 226.

In the embodiment of FIG. 12A, the top frame 226 includes a first portion 226a and a second portion 226b. The first portion 226a surrounds the second portion 226b and they are concentric circles. The first and second portions 226a and 226b have different band gaps, so they have different dielectric constants. A higher band gap induces lower electric field, and the deposition rate and amount deposit are reduced. On contrary, a lower band gap induces higher electric field, and the deposition rate and amount deposit are increased. If the first portion 126a has a higher band gap than the second portion 126b, the plasma concentration is gradually decreased outwardly. On contrary, if the first portion 126a has a lower band gap than the second portion 126b, the plasma concentration is gradually increased outwardly. The materials of the first and second portions 226a and 226b are the same or similar to the first and second portions 126a and 126b of FIG. 10A, and the detailed description is not repeated herein.

Figure 12B:
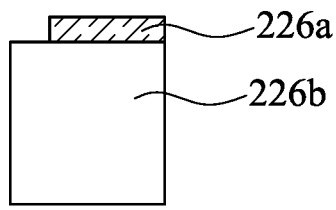
FIGS. 12B and 12C are cross-sectional views of the line A-A in FIG. 10A according to some embodiments.
Figure 12C:
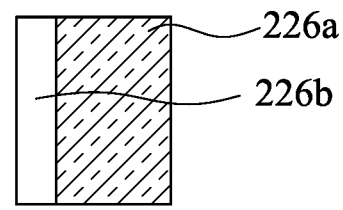

FIGS. 12B and 12C are cross-sectional views of the line A-A in FIG. 12A according to some embodiments. In some embodiments, the first portion 226a may be coated on the second portion 226b as shown in FIG. 12B; in some other embodiments, the first and second portions 226a and 226b may be rings with the same height and adhered together as shown in FIG. 12C.

The top frame 226 may be designed according to the desired plasma distribution. For example, if the initial plasma distribution is gradually increased outwardly, the top frame 226 in FIG. 12A (when the first portion 126a has a higher band gap than the second portion 126b) can be disposed in the processing chamber 210. Since the top frame 226 in FIG. 10A makes the plasma concentration gradually decrease outwardly, the resulting plasma concentration may become uniform, and the deposition performance can be improved.

Figure 12D:
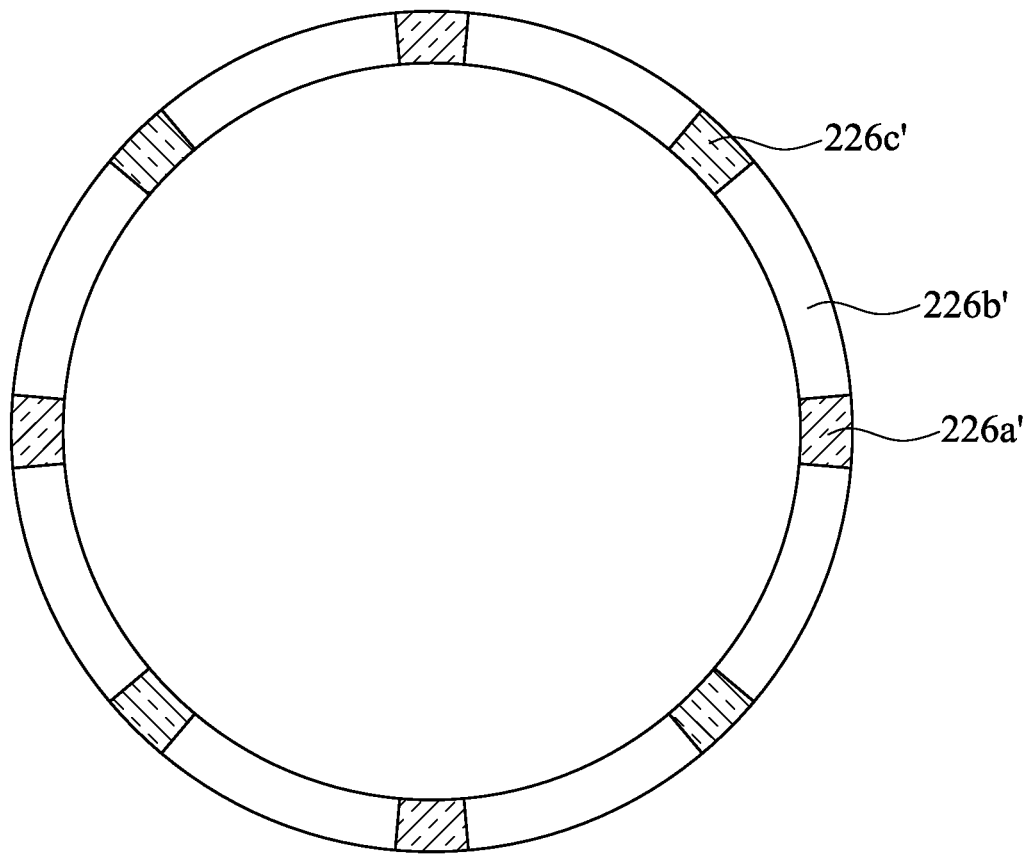
FIG. 12D is a schematic view of a top frame of the pedestal of FIG. 4 according to some embodiments.

FIG. 12D is a schematic view of a top frame of the pedestal 220 of FIG. 4 according to some embodiments. The top frame 226 includes a first portion 226a', a second portion 226b', and a third portion 226c'. The first, second, and third portions 226a', 226b', and 226c' are sectors and alternatively arranged as a circle. The first, second, and third portions 226a', 226b', and 226c' have different band gaps, so they have different dielectric constants. For example, the top frame 226 may be designed according to the desired plasma distribution. In some embodiments, the first and third portions 226a' and 226c' may be coated on the second portion 226b', or the first, second, and third portions 226a', 226b', and 226c' may have the same heights and are adhered together.

Figure 13:
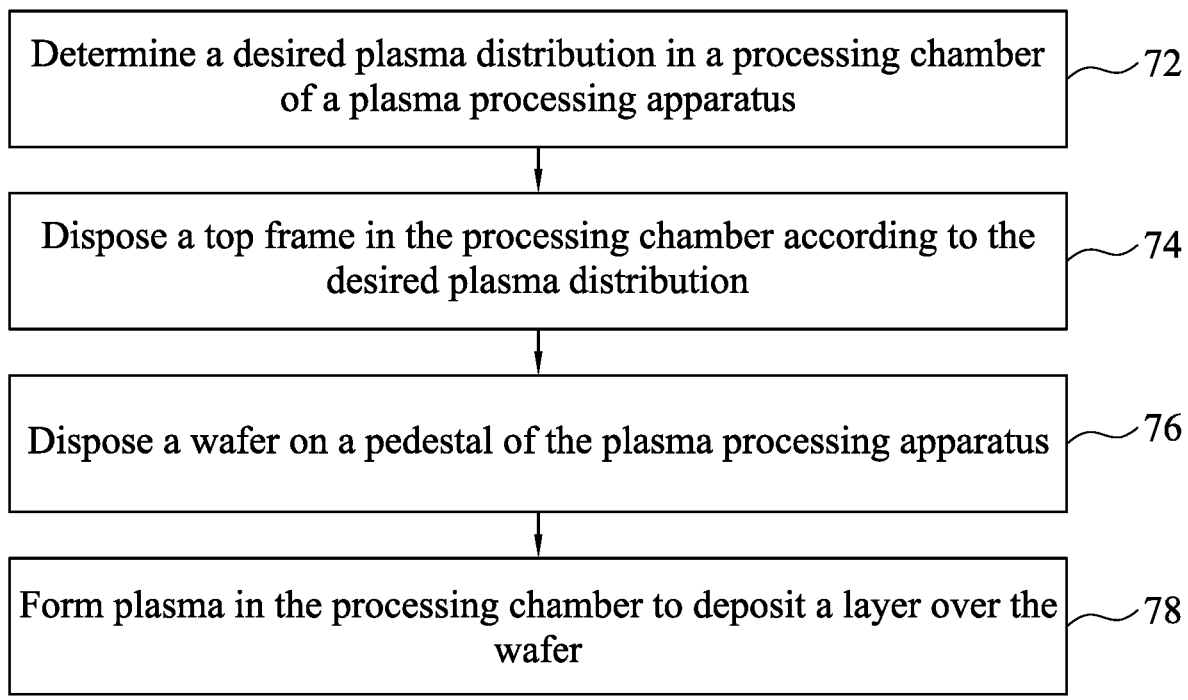
FIG. 13 is a flow chart of a method of a deposition process in accordance with some embodiments of the present disclosure.

FIG. 13 is a flow chart of a method M70 of a deposition process in accordance with some embodiments of the present disclosure. The method M70 may be used in the deposition process in FIG. 7C. Reference is made to FIGS. 4, 7C, and 13. In block 72, a desired plasma distribution in the processing chamber 210 is determined. In some embodiments, the initial plasma distribution of the plasma processing apparatus 200 is not uniform, and the desired plasma distribution is a uniform plasma distribution. In some other embodiments, the patterns over the wafer W have different heights in different regions (e.g., the patterns in the center region Wc are higher than the patterns in the peripheral region Wp). When the desired plasma distribution is non-uniform (e.g., the plasma concentration over the center region Wc is lower than the plasma concentration over the peripheral region Wp), the resulting deposited layers in deferent regions may have the same heights.

In block 74, a top frame is disposed in the processing chamber 210 according to the desired plasma distribution. Specifically, once the desired plasma distribution is determined, the electric field adjustment around the edge of the wafer W is determined. Then, a corresponding top frame that can induce the desired plasma distribution is chosen to be deposited in the processing chamber 210. In some embodiments, the corresponding top frame may be the top frames 226 in FIG. 12A or 12D.

In block 76, the wafer W is disposed on the pedestal 220, and the top frame 226 surrounds the wafer W. The first DC/AC RF source 260 may provide a desired voltage to the pedestal 220, and the wafer W is attracted on the pedestal 220.

In block 78, plasma P is formed in the processing chamber 210 to deposit a layer over the wafer W. Since the formation details of the plasma P is described above, a description is omitted herein.

With such operations, the plasma concentration over the top frame 226 is adjusted/tuned. As such, the liner layer 340 over the center region Wc of the substrate 310 and the liner layer 340 over the peripheral region Wp of the substrate 310 have the same or similar profile (or thickness). For example, the thickness t1 of the liner layer 340 over the center region Wc is substantially the same as the thickness t2 of the liner layer 340 over the peripheral region Wp.

FIGS. 14A to 14G illustrate a semiconductor structure at various stages according to some embodiments. In some embodiments, the semiconductor device shown in FIGS. 14A to 14G may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, bipolar transistors, high voltage transistors, high frequency transistors, other memory cells, and combinations thereof.

Reference is made to FIG. 14A. A substrate 410 is provided. In some embodiments, the substrate 410 and the substrate 310 in FIG. 7A are similar or the same, and the detailed description is not repeated herein. The substrate 410 includes a center region Wc and a peripheral region Wp. At least one semiconductor fin 412 is formed on the substrate 410, and a plurality of isolation structures (not shown) are formed on the substrate 410. Since the structural and manufacturing details of the semiconductor fin 412 and the isolation structures are similar to or the same as the semiconductor fins 316 and the isolation materials 350' of FIG. 7E, the detailed descriptions are not repeated herein.

A gate dielectric 430 is formed to cover the semiconductor fins 412. The gate dielectric 430 may be formed by thermal oxidation, chemical vapor deposition, sputtering, or other methods known and used in the art for forming a gate dielectric. The gate dielectric 430 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

A dummy layer 440 is formed on the gate dielectric 430. The dummy layer 440 may be deposited by chemical vapor deposition (CVD), by sputter deposition, or other suitable methods. The dummy layer 440 may include polycrystalline-silicon (poly-Si) or poly-crystalline silicon-germanium (poly-SiGe). For example, in some embodiments, the dummy layer 440 includes polysilicon deposited undoped by low-pressure chemical vapor deposition (LPCVD). The polysilicon may also be deposited, for example, by furnace deposition of an in-situ doped polysilicon. Alternatively, the dummy layer 440 may includes other suitable materials. Further, the dummy layer 440 may be doped poly-silicon with uniform or non-uniform doping.

A mask layer 490 is formed on the dummy layer 440 by suitable process(es) to a suitable thickness. The mask layer 490 covers a portion of the dummy layer 440 while leaves other portions of the dummy layer 440 uncovered. The mask layer 490, in some embodiments, is a hard mask layer which includes silicon oxide. The mask layer 490, in some other embodiments, may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS)-formed oxide, other suitable materials, and/or combinations thereof. In some other embodiments, the mask layer 490 may be a photo-resist layer. The photo-resist layer is deposited on the dummy layer 440, for example, by spin coating, and is used to form an intended pattern by way of irradiating, developing, drying, etching, and other suitable processes. In some embodiments, the mask layer 490 includes a silicon nitride layer 492 disposed on the dummy layer 440 and an oxide layer 494 disposed on the silicon nitride layer 492.

For the case that the mask layer 490 is formed by using the plasma enhanced deposition method such as PECVD, the mask layer 490 may be formed in the plasma processing apparatus 200 of FIG. 4 and using the method M30 of FIG. 9A, M30' of FIG. 9B, or the method M70 of FIG. 13. As such, the mask layer 490 over the center region Wc and the mask layer 490 over the peripheral region Wp have the same or similar profile (or thickness).

Figure 14B:
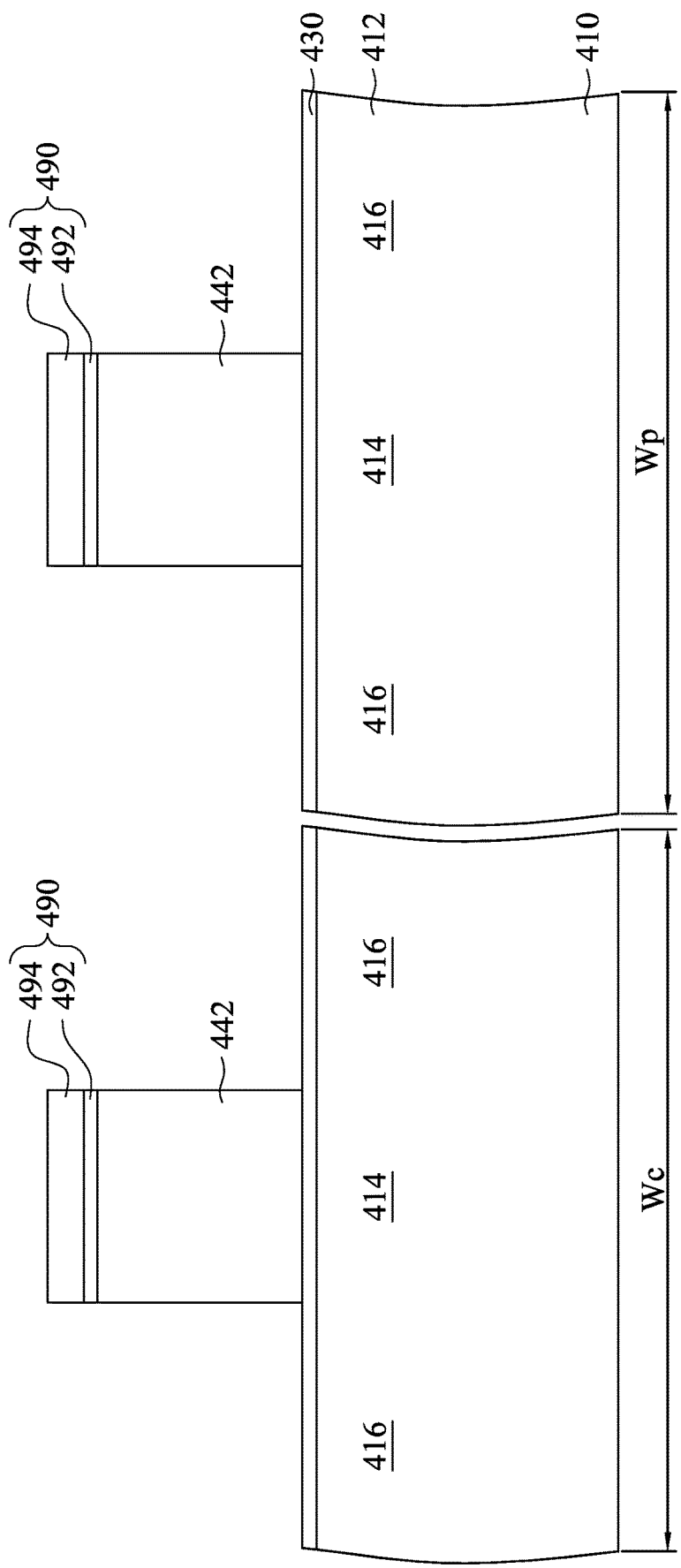

Reference is made to FIG. 14B. A removing (or etching) process is performed to remove portions other than the intended pattern of the dummy layer 440 (see FIG. 14A) (i.e., the portions uncovered by the mask layer 490) to form a dummy gate 442. In some embodiments, such an etch process may be a plasma enhanced etching process. As a result, the pattern of the dummy gate 442 as shown in FIG. 14B is obtained. At least a portion of the semiconductor fin 412 covered by the dummy gate 442 is referred as a channel portion 414 of the semiconductor fin 412, and other portions of the semiconductor fin 412 uncovered by the dummy gate 442 is referred as uncovered portions 416.

For the case that the dummy layer 440 is etched by using the plasma enhanced etching method, the dummy layer 440 may be etched in the plasma processing apparatus 100 of FIG. 1 and using the method M10 of FIG. 8A, the method M10' of FIG. 8B, or the method M50 of FIG. 11. As such, the dummy gate 442 over the center region Wc and the dummy gate 442 over the peripheral region Wp have the same or similar profile (or thickness).

Figure 14C:
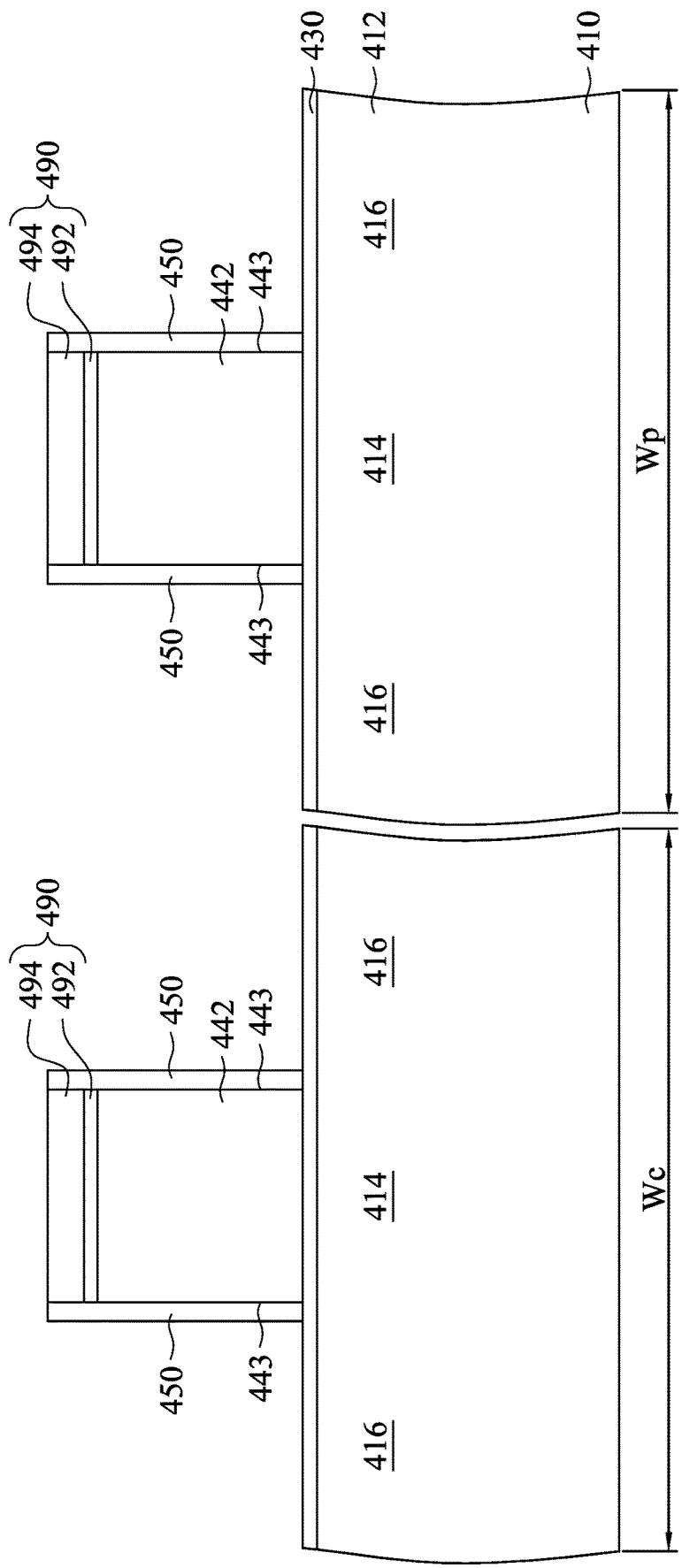

Reference is made to FIG. 14C. A plurality of gate spacers 450 are formed on opposing sidewalls 443 of the dummy gate 442 and the mask layer 490. In some embodiments, at least one of the gate spacers 450 includes single or multiple layers. The gate spacers 450 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, other suitable methods. The gate spacers 450 may include different materials with different etch characteristics than the dummy layer 440 so that the gate spacers 450 may be used as masks for the removing of the dummy gate 442 (described below with references to FIG. 14F). The gate spacers 450 may then be patterned, such as by one or more etches to remove the portions of the gate spacers 450 from the horizontal surfaces of the structure.

Figure 14D:
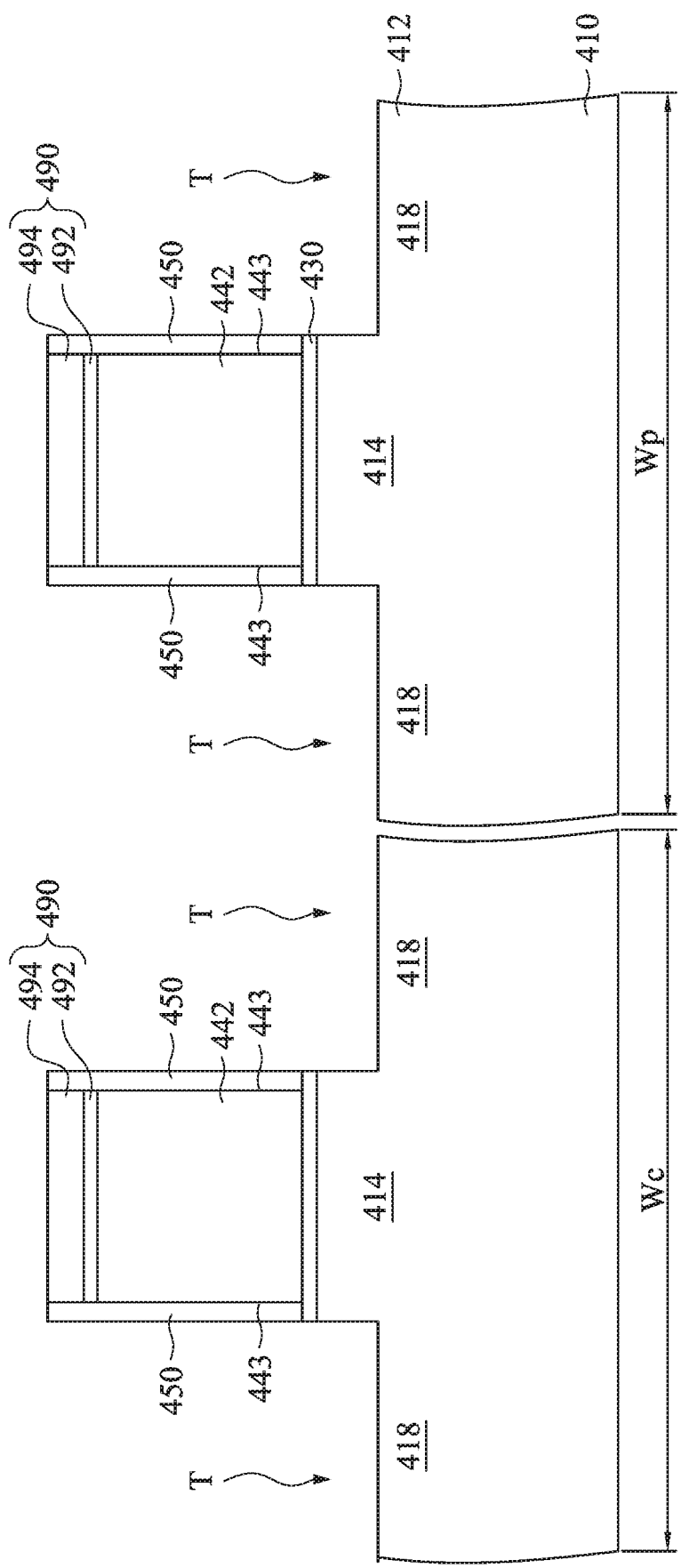

Reference is made to FIG. 14D. The uncovered portions 116 (see FIG. 14C) of the semiconductor fin 412 are removed (or recessed) to form trenches T in the substrate 410. Any suitable amount of material may be removed. The remaining semiconductor fin 412 includes the channel portion 414 and recessed portions 418, where the trenches T are respectively formed on the recessed portions 418.

Figure 14E:
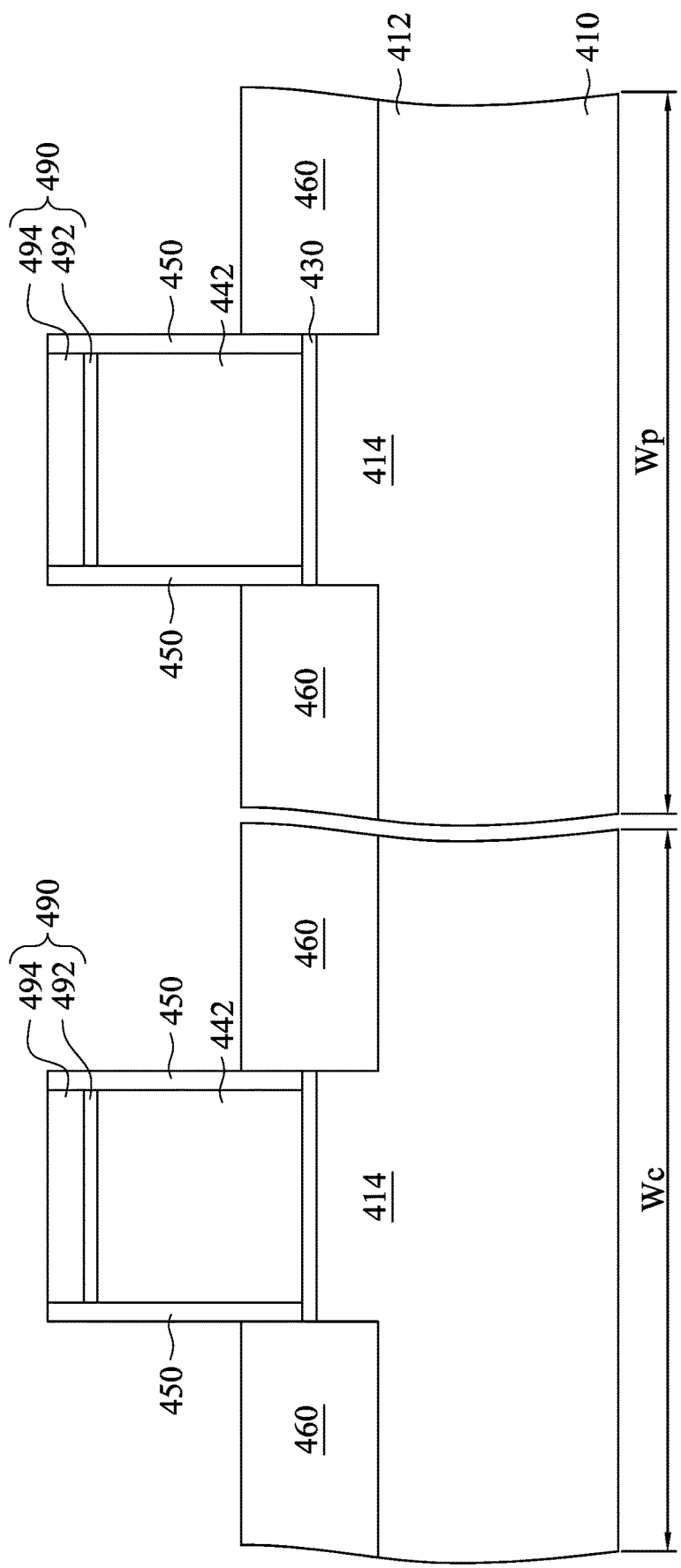

Reference is made to FIG. 14E. At least one epitaxy structure 460 is formed in the trench T (FIG. 14D) of the semiconductor fins 412. The epitaxy structure 460 protrudes from the trench T and is in contact with the channel portion 414 of the semiconductor fin 412. The epitaxy structure 460 can be an n-type epitaxy structure or a p-type epitaxy structure. The epitaxy structure 460 may be formed using one or more epitaxy or epitaxial (epi) processes, such that Si features, SiGe features, and/or other suitable features can be formed in a crystalline state on the semiconductor fin 412. The epitaxy structure 460 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

Figure 14F:
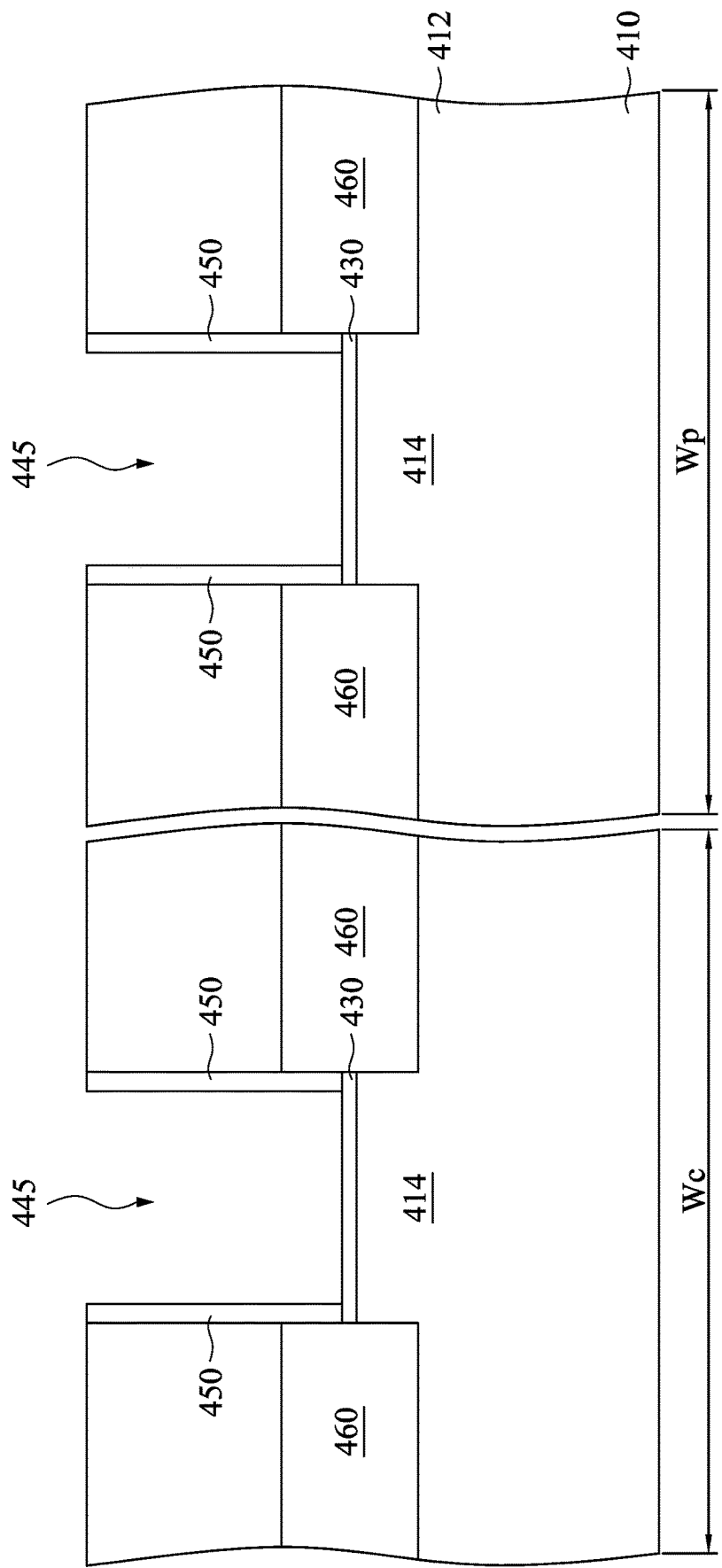

Reference is made to FIG. 14F. The dummy gate 442 and the mask layer 490 of FIG. 14E are removed to form openings 445. In some embodiments, before removing the dummy gate 440 and the mask layer 490, an interlayer dielectric (ILD) 470 is formed at outer sides of the gate spacers 450 on the substrate 410. The ILD 470 includes silicon oxide, oxynitride or other suitable materials. The ILD 470 includes a single layer or multiple layers. The ILD 470 is formed by a suitable technique, such as CVD or ALD. A chemical mechanical planarization (CMP) process may be applied to remove excessive ILD 470 and expose the top surface of the dummy gate 440 to a subsequent dummy gate removing process.

In the present disclosure, a replacement gate (RPG) process scheme is employed. In some embodiments, in a RPG process scheme, a dummy polysilicon gate is formed first and is replaced later by a metal gate after high thermal budget processes are performed. In some embodiments, the dummy gate 440 (see FIG. 14B) is removed to form the opening 445 with the gate spacers 450 as its sidewalls. The dummy gate 440 may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 14G:
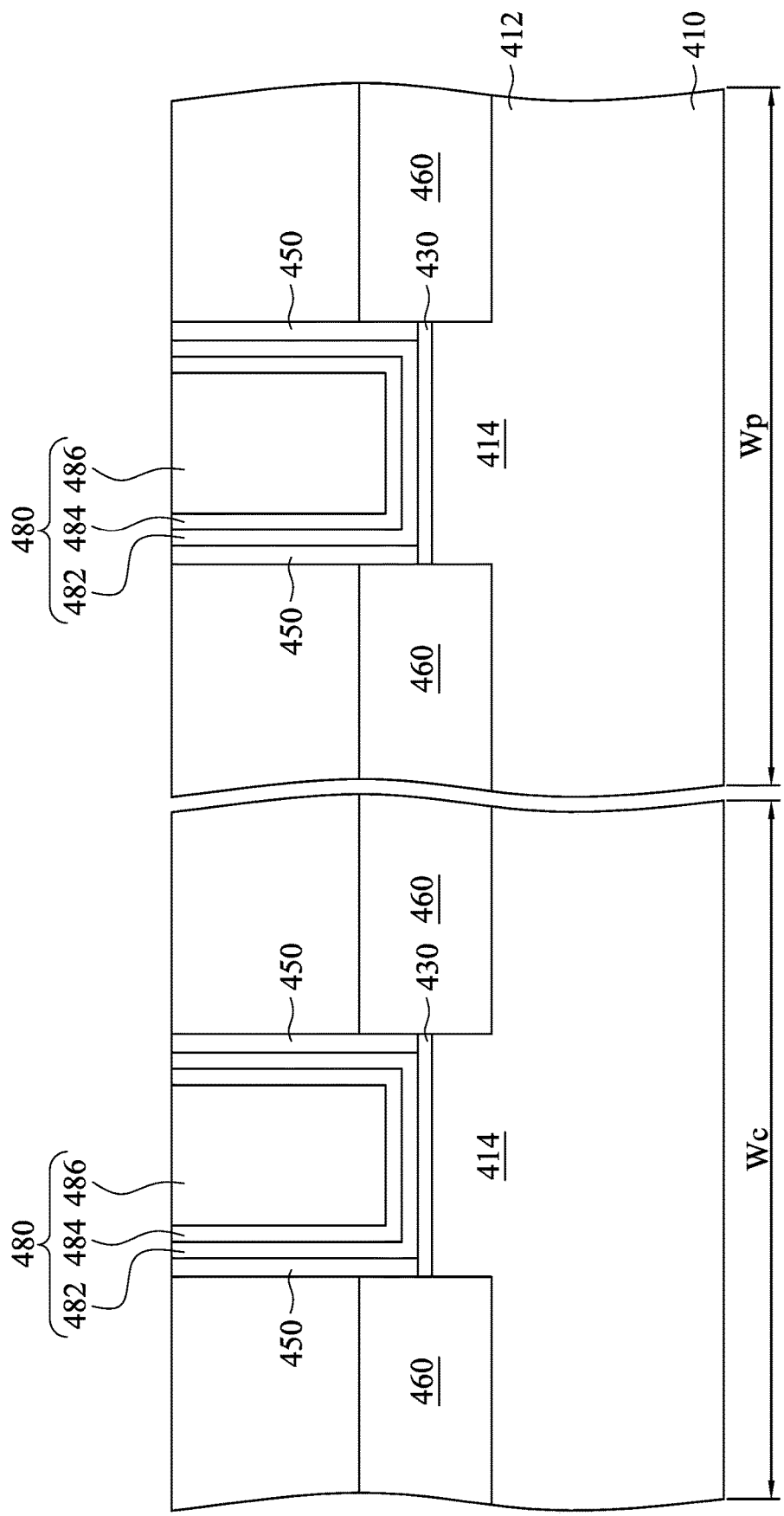

Reference is made to FIG. 14G. A gate electrode 480 is formed in the opening 445. In other words, the gate spacers 450 are disposed on opposite sides of the gate electrode 480. The gate electrode 480 formed may also include gate dielectric layer(s), capping layer(s), fill layer(s), and/or other suitable layers that are desirable in a metal gate stack. In some embodiments, the gate electrode 480 includes a high dielectric constant (high-κ) dielectric layer 482, a work function metal layer 484, and a fill metal 486. In some embodiments, the high-κ dielectric layer 482 may have a dielectric constant (κ) higher than the dielectric constant of $SiO_2$, i.e. κ>3.9. The high-κ dielectric layer 482 may include doped $HfO_2$, lead zirconate titanate (PZT), LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, or other suitable materials. The high-κ dielectric layer 482 is deposited by suitable techniques, such as thermal-ALD, PEALD, CVD, PVD, thermal oxidation, combinations thereof, or other suitable techniques. In some embodiments, the high-κ dielectric layer 482 is formed using $HfCl_4$, TDMA-Hf, or TEMA-HF as a precursor and using $O_3$, $H_2O$, or $O_2$ as oxidant.

The work function metal layer 484 included in the gate electrode 480 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer 484 may include a plurality of layers. The work function layer(s) 484 may be deposited by CVD, PVD, electroplating and/or other suitable process. In an embodiment, the gate electrode 480 formed is a p-type metal gate including a p-type work function layer. In some embodiments, the fill layer 486 included in the gate electrode 480 may includes tungsten (W). The metal layer 486 may be deposited by ALD, PVD, CVD, or other suitable process.

For the case that one or more layers of the gate electrode 480 is(are) formed by using the plasma enhanced deposition process, the layers may be formed in the plasma processing apparatus 200 of FIG. 4 and using the method M30 of FIG. 9A, M30' of FIG. 9B, or the method M70 of FIG. 13. As such, the layers of the gate electrode 480 over the center region Wc and the layers of the gate electrode 480 over the peripheral region Wp have the same or similar profile (or thickness).

FIGS. 15A to 15E illustrate a semiconductor structure at various stages according to some embodiments. In some embodiments, the semiconductor device shown in FIGS. 15A to 15E may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, bipolar transistors, high voltage transistors, high frequency transistors, other memory cells, and combinations thereof.

Figure 15A:
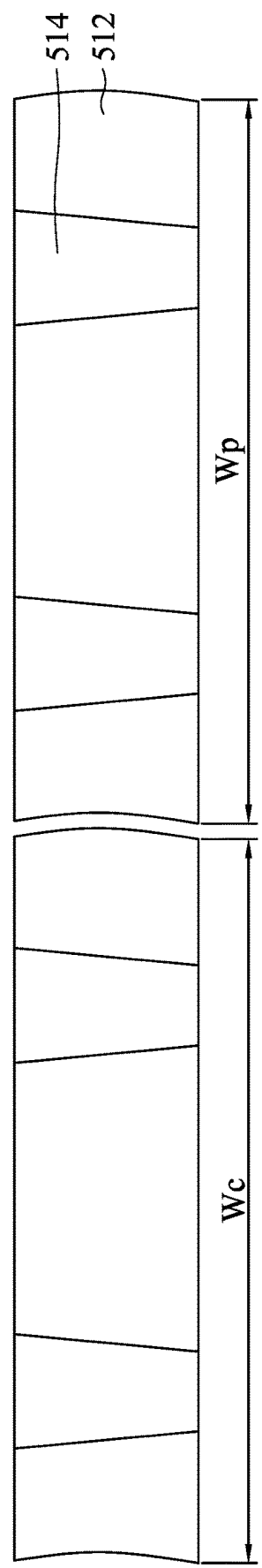
FIGS. 15A to 15E illustrate a semiconductor structure at various stages according to some embodiments.

Reference is made to FIG. 15A. A wafer 510 is provided. The wafer 510 includes a first interlayer dielectric 512. In some embodiments, the wafer W includes a center region Wc and a peripheral region Wp. The wafer 510 may include a substrate (not explicitly shown) underlying the first interlayer dielectric (ILD) 512, and may include, for example, bulk silicon, doped or undoped, or an active layer of a semiconductor-on-insulator (SOI) substrate. In some embodiments, an SOI substrate includes a layer of a semiconductor material, such as silicon, formed on an insulator layer. The insulator layer may be, for example, a buried oxide (BOX) layer or a silicon oxide layer. The insulator layer is provided on a substrate and may be a silicon or glass substrate. Other substrates, such as a multi-layered or gradient substrate may also be used.

In some embodiments, electrical circuitry is formed on the substrate and may be some types of circuitry suitable for a particular application. In some embodiments, the electrical circuitry includes electrical devices formed on the substrate with one or more dielectric layers overlying the electrical devices. Metal layers may be formed between overlying dielectric layers, such as those discussed herein, to route electrical signals between the electrical devices. Electrical devices may also be formed in one or more dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The first ILD 512 may be formed, for example, of a low-K dielectric material (materials having a dielectric constant lower than silicon dioxide), such as silicon oxynitride, phosphosilicate glass (PSG), borophosphosilicate glass (BPSG), fluorinated silicate glass (FSG), $SiO_xC_y$, $SiO_xC_yH_z$, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). Other materials, such as ultra low-k materials (e.g., having a dielectric constant less than about 2.9), such as k=2.5-2.6, may also be used. These materials and processes are provided as examples and other materials and processes may be used.

For the case that the first ILD 512 is formed by using the plasma enhanced deposition method such as PECVD, the first ILD 512 may be formed in the plasma processing apparatus 200 of FIG. 4 and using the method M30 of FIG. 9A, M30' of FIG. 9B, or the method M70 of FIG. 13. As such, the first ILD 512 over the center region Wc and the first ILD 512 over the peripheral region Wp have the same or similar profile (or thickness).

Conductors 514 are formed in the first interlayer dielectric 512. The conductors 514 may be formed by, for example, creating openings in the first interlayer dielectric 512 using photolithography techniques. In some embodiments, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing operations, such as etching, performed to form the openings in which the conductors 514 are to be formed in the first ILD 512. The etching process may be a wet or dry, anisotropic or isotropic, etch process, such as an anisotropic dry etch process. After the openings are formed in the first ILD 512, a conductive material may be deposited to fill the openings. The conductors 514 may include metals, elemental metals, transition metals, or the like, such as a copper interconnect.

For the case that the first ILD 512 is etched by using the plasma enhanced etching method, the first ILD 512 may be etched in the plasma processing apparatus 100 of FIG. 1 and using the method M10 of FIG. 8A, the method M10' of FIG. 8B, or the method M50 of FIG. 11. As such, the openings over the center region Wc and the openings over the peripheral region Wp have the same or similar profile.

Figure 15B:
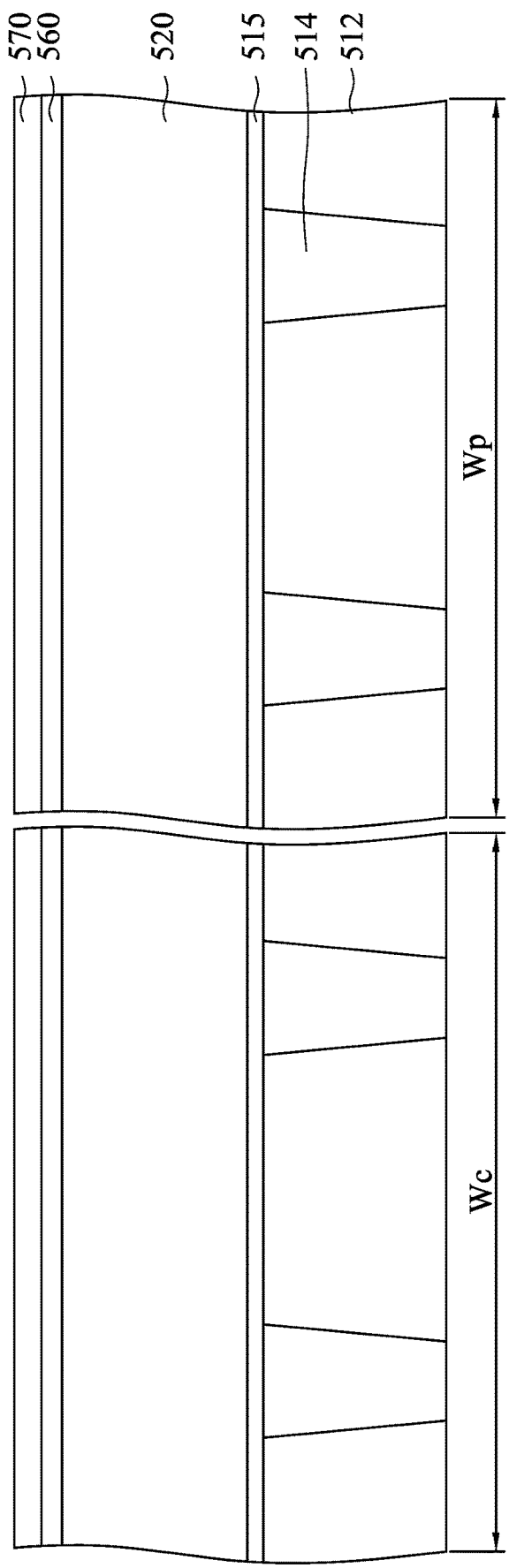

Reference is made to FIG. 15B. An etch stop layer (ESL) 515 is formed over the first ILD 512. Then, a second ILD 520 is formed over the ESL 515 in accordance with some embodiments. The second ILD 520 is a layer that is to be subsequently patterned to, for example, form conductive lines and/or vias. For example, the second ILD 520 may be patterned to form vias extending to the conductors 514 and to form conductive lines to interconnect various electrical elements.

The second ILD 520 may be formed of similar materials using similar processes as those used to form the first ILD 512; however, different materials and processes may be used. That is, the second ILD 520 may be formed in the plasma processing apparatus 200 of FIG. 4 and using the method M30 of FIG. 9A, M30' of FIG. 9B, or the method M70 of FIG. 13. Additionally, the second ILD 520 may be formed of the same or different material as that used to form the first ILD 512.

Layers are formed over the second interlayer dielectric 520. Anti-Reflective coating Layer (ARL) 560 is formed over the second interlayer dielectric 520. ARL 560 may be a Nitrogen-Free ARL (NFARL), which may be formed of an oxide in accordance with some exemplary embodiments. For example, NFARL may include silicon oxide formed using plasma enhanced chemical vapor deposition (PECVD). Mask layer 570 is formed over the ARL 560. The mask layer 570 is also referred to as hard mask layer 570 hereinafter. In accordance with some embodiments, the hard mask layer 570 includes a metal(s), which may be in the form of a metal nitride. The hard mask layer 570 may also be formed of a non-metal nitride such as silicon nitride, an oxynitride such as silicon oxynitride, or the like. Another ARL may be further formed over the hard mask layer 570. ARL may also be an NFARL, which may be formed of an oxide, such as silicon oxide formed using PECVD.

For the case that the layer(s) 560 and/or 570 is(are) formed by using the plasma enhanced deposition method such as PECVD, the layer(s) 560 and/or 570 may be formed in the plasma processing apparatus 200 of FIG. 4 and using the method M30 of FIG. 9A, M30' of FIG. 9B, or the method M70 of FIG. 13. As such, the layer(s) 560 and/or 570 over the center region Wc and the layer(s) 560 and/or 570 over the peripheral region Wp have the same or similar profile (or thickness).

Figure 15C:
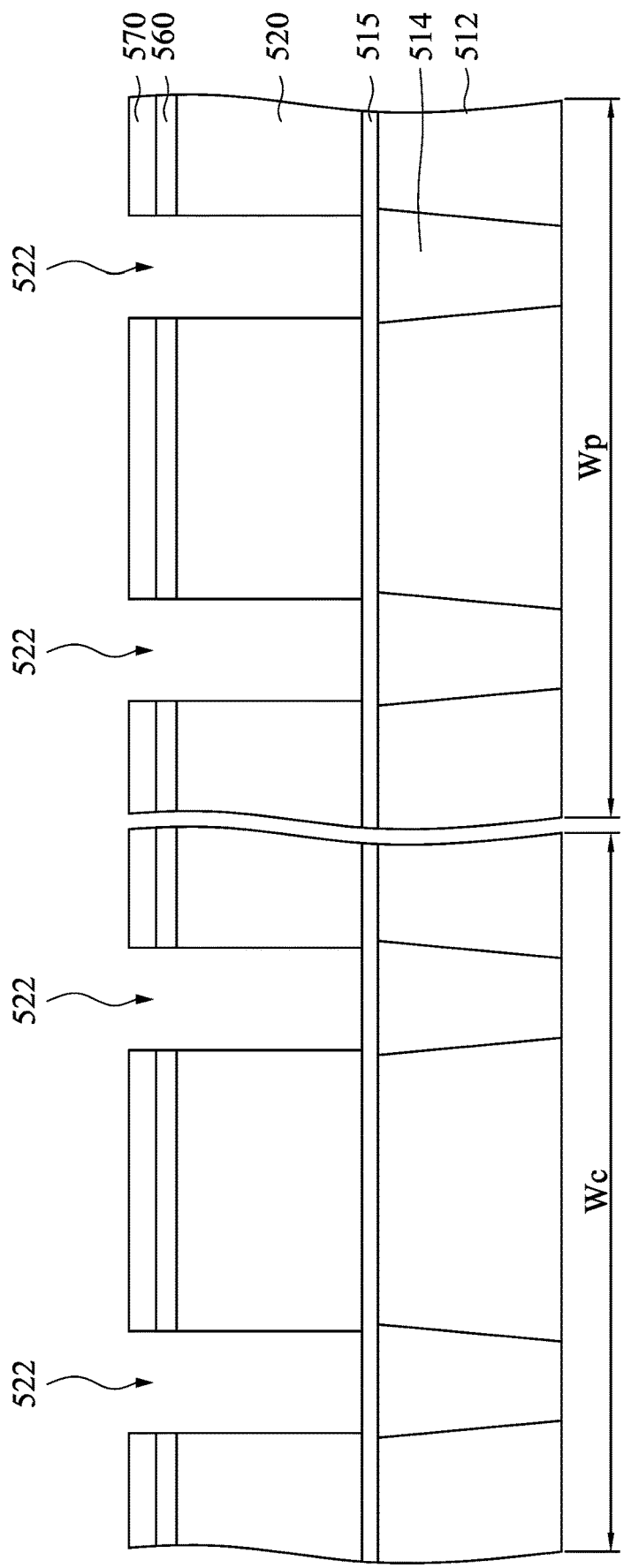

Reference is made to FIG. 15C. ARL and the hard mask layer 570 are patterned to from openings. In accordance with some embodiments, the openings are formed using a two-patterning-two-etching (2P2E) process. The patterned ARL and the hard mask layer 570 are used as an etching mask to etch ARL 560 and the second interlayer dielectric 520. Accordingly, the openings extend into the second interlayer dielectric 520 to form the openings 522. The etching is finished when the openings 522 expose the ESL 515. During the etching, ARL formed above the hard mask layer 570 may be consumed, leaving the hard mask layer 570 as a top layer as shown in FIG. 15C.

For the case that the openings 522 are formed by using the plasma enhanced etching method, the second ILD 520 may be etched in the plasma processing apparatus 100 of FIG. 1 and using the method M10 of FIG. 8A, the method M10' of FIG. 8B, or the method M50 of FIG. 11. In some other embodiments, the second ILD 520 may be etched in the plasma processing apparatus 100 with the top frames 126 shown in FIG. 10A or 10D. As such, the openings 522 over the center region Wc and the openings 522 over the peripheral region Wp have the same or similar profile (or depth).

Figure 15D:
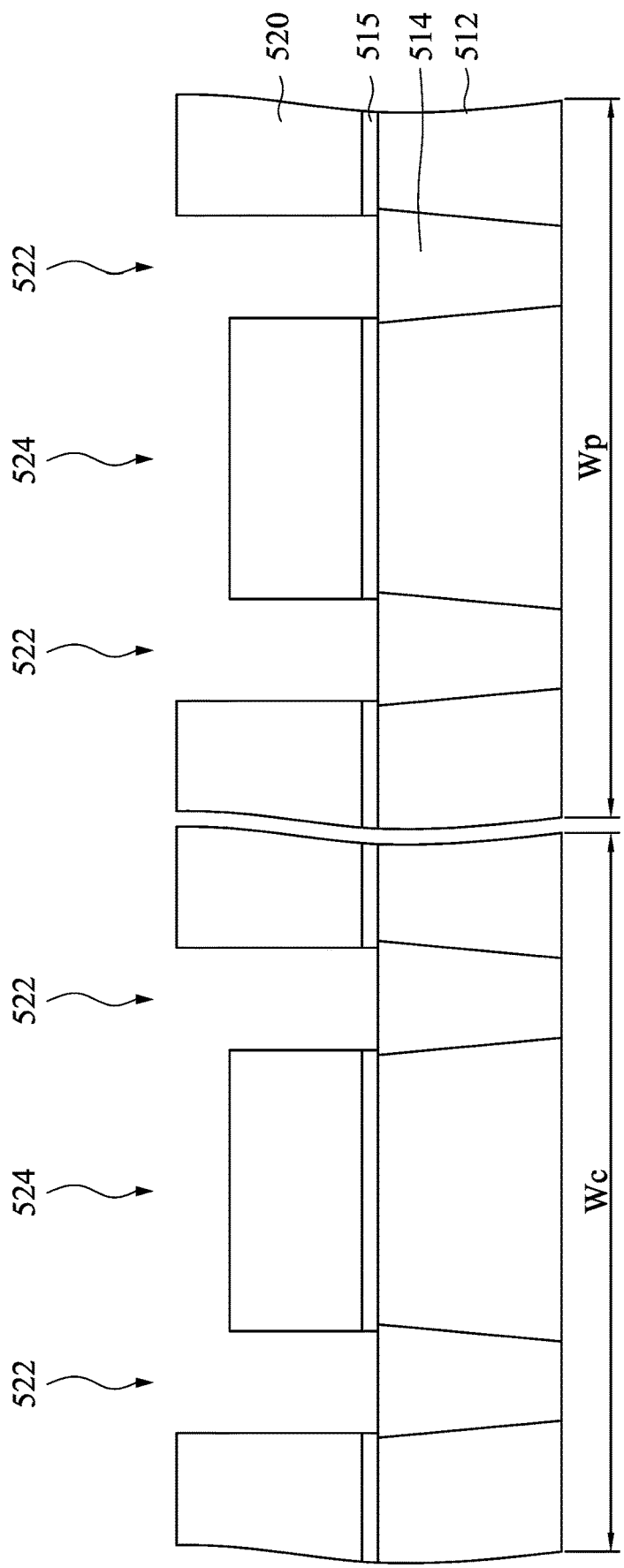

Reference is made to FIG. 15D. Trenches 524 are formed in the second ILD 520. The trenches 524 may interconnect the openings 522 in some embodiments. Moreover, the openings 522 pass through the ESL 515 to respectively expose the conductors 514. In some embodiments, the openings 522 and the trench 524 may be formed by performing multiple etching processes. After the openings 522 and the trench 524 are formed, the hard mask layer 570 and the ARL 560 (see FIG. 15C) are removed.

Figure 15E:
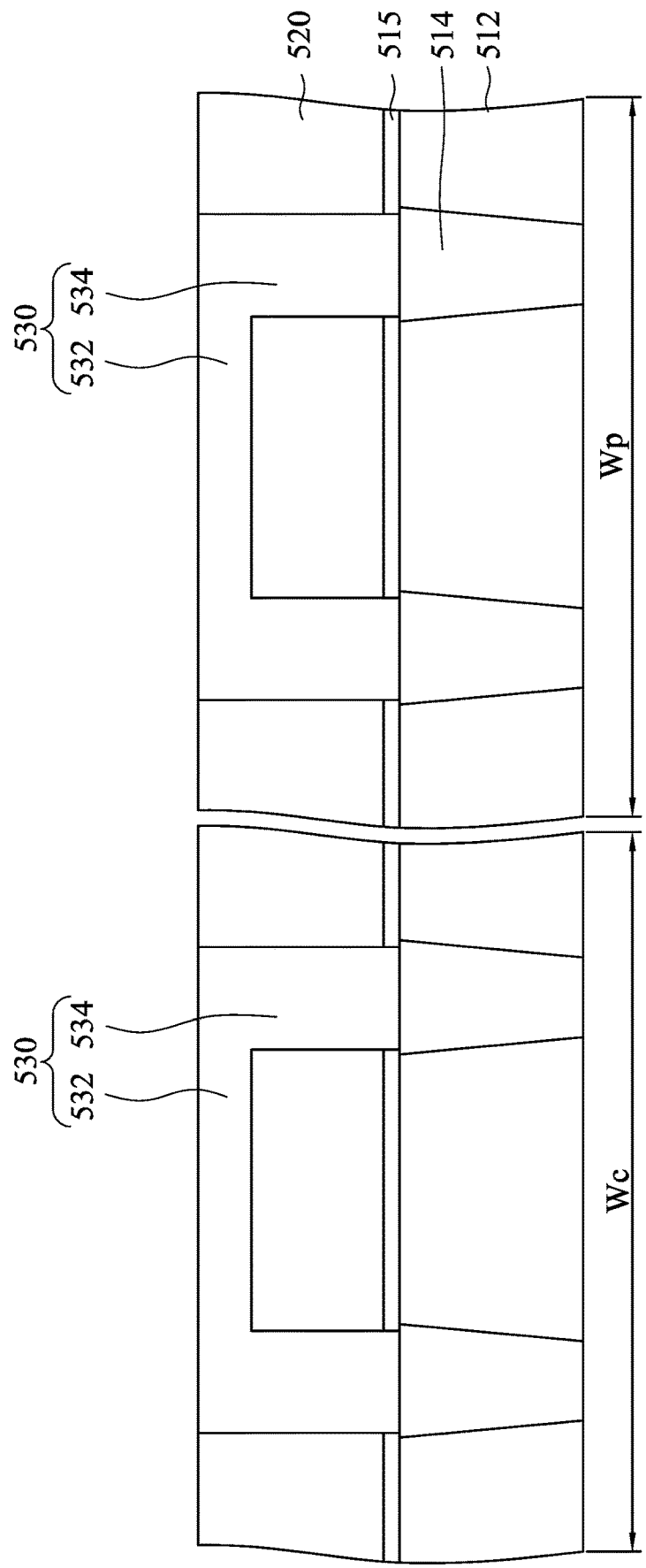

Reference is made to FIG. 15E. A conductive material is formed in the openings 522 and the trench 524. The conductive material at least includes metal element, e.g., copper (Cu). The conductive material may include other suitable materials such as Ru, W, Ti, Al, Co, or combinations thereof.

A chemical mechanical polishing (CMP) process is performed after the formation of the conductive material to remove the excess portions of the conductive material outside the trench 524, thus exposing the top surface of the second interlayer dielectric 520 and achieving a planarized surface. The portions of the conductive material in the openings 522 are referred to as vias 532, and the portion of the conductive material in the trench 524 is referred to as a conductive line 534. That is, the vias 532 and the conductive line 534 are conductors. The vias 532 are in contact with the conductors 514. In some embodiments, the conductive line 534 interconnects the vias 532, and the present disclosure is not limited in this respect.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the etching/deposition profiles of the wafer at different regions are uniform because of improved uniformity of the plasma distribution. Another advantage is that increased throughput and hence reduced fabrication cost can be provided, because the yield is raised. Yet another advantage is that desired plasma distributions can be achieved, because the edge electric field generator can tune the electric field around the peripheral region of the wafer.

According to some embodiments, a method for manufacturing a semiconductor structure includes depositing a wafer in a processing chamber. Plasma is formed in the processing chamber to process the wafer. A plasma concentration over a peripheral region of the wafer is detected. A plasma distribution over the peripheral region of the wafer is adjusted according to the detected plasma concentration.

According to some embodiments, a method for manufacturing a semiconductor structure includes determining a desired plasma distribution in a processing chamber. A top frame is deposited in the processing chamber according to the desired plasma distribution. A wafer is disposed on a pedestal in the processing chamber. The top frame surrounds the wafer. Plasma is formed in the processing chamber to process the wafer.

According to some embodiments, a plasma processing apparatus includes a processing chamber, a pedestal, a top electrode, a first DC/AC RF source, a sensor, and a control module. The pedestal is in the processing chamber and includes a top frame and an edge electric field generator. The edge electric field generator is configured to generate an electric field at the top frame. The top electrode is in the processing chamber and over the pedestal. The first DC/AC RF source is connected to the pedestal and the top electrode to generate an RF electromagnetic field between the pedestal and the top electrode. The sensor is over the pedestal and is configured to detect a plasma concentration over the top frame. The control module is connected to the sensor and the edge electric field generator and is configured to control an electric field of the edge electric field generator according to the detected plasma concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    depositing a wafer on a pedestal and in a processing chamber, wherein the pedestal comprises a dielectric sheet supporting the wafer and a top frame connected to the dielectric sheet and laterally surrounding the wafer;
    forming plasma in the processing chamber to process the wafer;
    detecting a plasma concentration directly over the top frame; and
    adjusting a plasma distribution directly over the top frame according to the detected plasma concentration.

2. The method of claim 1, further comprising adjusting a temperature at a peripheral region of the wafer according to the detected plasma concentration.

3. The method of claim 1, further comprising attracting the wafer on the pedestal in the processing chamber before adjusting the plasma distribution.

4. The method of claim 1, wherein forming plasma in the processing chamber to process the wafer comprises etching the wafer.

5. The method of claim 1, wherein forming plasma in the processing chamber to process the wafer comprises depositing a layer over the wafer.

6. The method of claim 1, wherein adjusting the plasma distribution directly over the top frame comprises generating an electric field at the top frame according to the detected plasma concentration.

7. The method of claim 6, wherein forming plasma in the processing chamber to process the wafer comprises generating an RF electromagnetic field in the processing chamber.

8. The method of claim 1, further comprising adjusting a pressure in the processing chamber according to the detected plasma concentration.

9. The method of claim 8, wherein adjusting the pressure in the processing chamber comprises adjusting a flow rate of a process gas introduced into the processing chamber.

10. A method for manufacturing a semiconductor structure, comprising:
    determining a desired plasma distribution in a processing chamber;
    determining locations of a first portion and a second portion of a top frame of a pedestal according to the desired plasma distribution, wherein the first portion and the second portion of the top frame comprise different materials;
    disposing the top frame in the processing chamber after determining the locations of the first portion and the second portion of the top frame;
    disposing a wafer on the pedestal in the processing chamber, wherein the top frame surrounds the wafer; and
    forming plasma in the processing chamber to process the wafer.

11. The method of claim 10, wherein the second portion of the top frame has a band gap different from the first portion of the top frame, and the first and second portions are sector-shaped.

12. The method of claim 10, wherein the first and second portions of the top frame are both dielectric materials.

13. The method of claim 10, wherein the second portion of the top frame has a band gap higher than the first portion of the top frame, and the first and second portions are concentric circles.

14. The method of claim 13, wherein the first portion of the top frame surrounds the second portion of the top frame.

15. The method of claim 13, wherein the second portion of the top frame surrounds the first portion of the top frame.

16. A plasma processing apparatus comprising:
a processing chamber;
a pedestal in the processing chamber and comprising a top frame, a bottom frame, a dielectric sheet, and an edge electric field generator, wherein the edge electric field generator is configured to generate an electric field at the top frame, the top frame and the bottom frame surround the dielectric sheet, and a conductive element of the edge electric field generator is between an outer sidewall of the bottom frame and an outer sidewall of the dielectric sheet;
a top electrode in the processing chamber and over the pedestal;
a first DC/AC RF source connected to the pedestal and the top electrode to generate an RF electromagnetic field between the pedestal and the top electrode;
a sensor over the pedestal and configured to detect a plasma concentration over the top frame; and
a control module connected to the sensor and the edge electric field generator and configured to control the electric field of the edge electric field generator according to the detected plasma concentration.

17. The plasma processing apparatus of claim 16, wherein the edge electric field generator further comprises:
a second DC/AC RF source connected to the conductive element.

18. The plasma processing apparatus of claim 16, wherein the conductive element is in the top frame.

19. The plasma processing apparatus of claim 16, wherein the conductive element is in the bottom frame.

20. The plasma processing apparatus of claim 16, wherein the conductive element is between the top frame and the dielectric sheet.

* * * * *